United States Patent
Zheng et al.

(10) Patent No.: US 10,388,852 B2
(45) Date of Patent: Aug. 20, 2019

(54) MAGNETIC TUNNEL JUNCTION ELEMENT

(71) Applicant: GLOBALFOUNDRIES Singapore Pte. Ltd., Singapore (SG)

(72) Inventors: Ping Zheng, Singapore (SG); Eng Huat Toh, Singapore (SG); Elgin Kiok Boone Quek, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 17 days.

(21) Appl. No.: 15/176,172

(22) Filed: Jun. 8, 2016

(65) Prior Publication Data
US 2017/0358734 A1 Dec. 14, 2017

(51) Int. Cl.
| | | |
|---|---|---|
| H01L 43/02 | (2006.01) | |
| H01L 27/22 | (2006.01) | |
| H01L 43/08 | (2006.01) | |
| H01L 43/10 | (2006.01) | |
| H01L 43/12 | (2006.01) | |

(52) U.S. Cl.
CPC ............ *H01L 43/02* (2013.01); *H01L 27/228* (2013.01); *H01L 43/08* (2013.01); *H01L 43/10* (2013.01); *H01L 43/12* (2013.01)

(58) Field of Classification Search
CPC ....... H01L 27/222; H01L 43/02; H01L 43/08; H01L 43/12; G01R 33/098; G11B 5/3909
See application file for complete search history.

(56) References Cited

U.S. PATENT DOCUMENTS

| | | | | |
|---|---|---|---|---|
| 7,276,384 | B2* | 10/2007 | Parkin | G11C 11/16 257/295 |
| 2012/0281461 | A1* | 11/2012 | Asao | G11C 11/16 365/158 |
| 2016/0268499 | A1* | 9/2016 | You | H01L 43/12 |
| 2017/0141157 | A1* | 5/2017 | Sakai | H01L 27/226 |

OTHER PUBLICATIONS

J.M. Slaughter et al., High Density ST-MRAM Technology (Invited), Electron Devices Meeting (IEDM), 2012, IEEE, San Francisco, USA.

* cited by examiner

*Primary Examiner* — Marc Anthony Armand
*Assistant Examiner* — Quinton A Brasfield
(74) *Attorney, Agent, or Firm* — Thompson Hine LLP

(57) ABSTRACT

Devices and methods for forming a device are disclosed. A substrate having circuit component formed on a substrate surface is provided. Back end of line processing is performed to form an upper inter level dielectric (ILD) layer over the substrate. The upper ILD layer includes a plurality of ILD levels. A pair of magnetic tunneling junction (MTJ) stacks is formed in between adjacent ILD levels of the upper ILD layer. Each of the MTJ stack includes a fixed layer, a tunneling barrier layer and a free layer. The fixed layer has a first width. The tunneling barrier layer is formed on the fixed layer. The free layer is formed on the tunneling barrier layer. The free layer has a second width. The first width is wider than the second width.

20 Claims, 20 Drawing Sheets

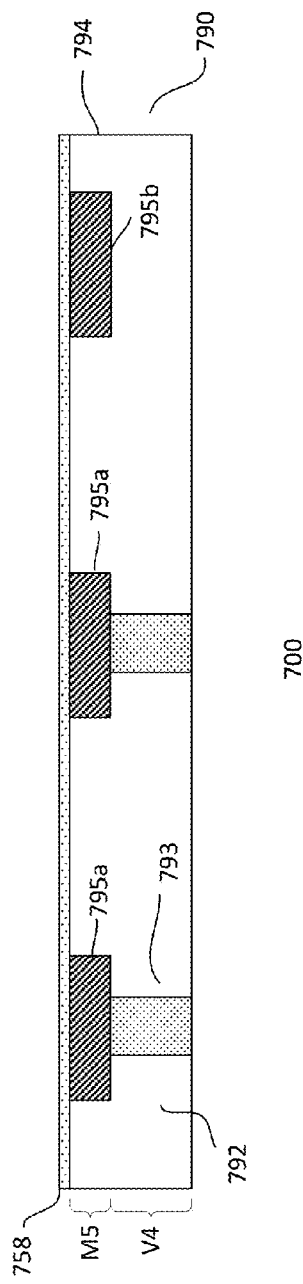
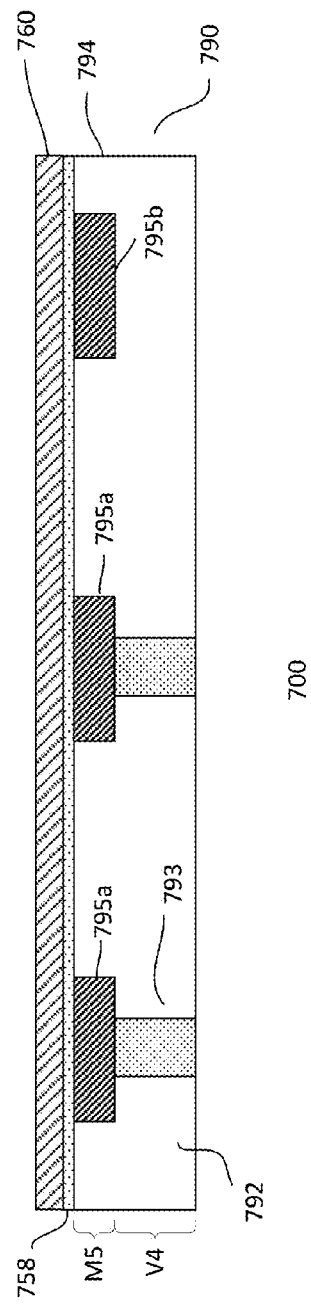
Fig. 7a
Fig. 7b

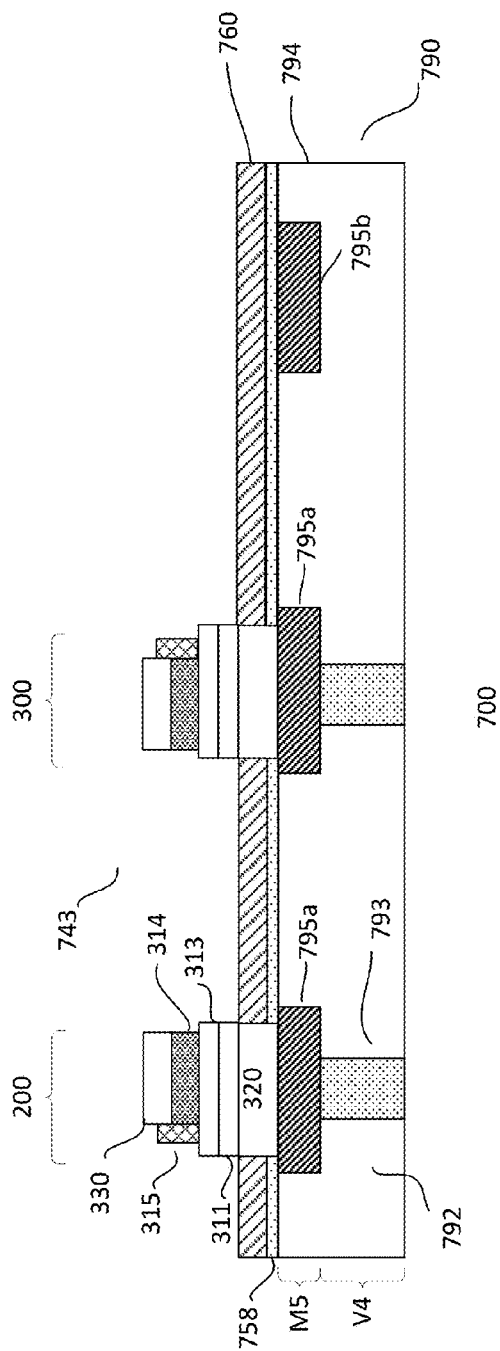
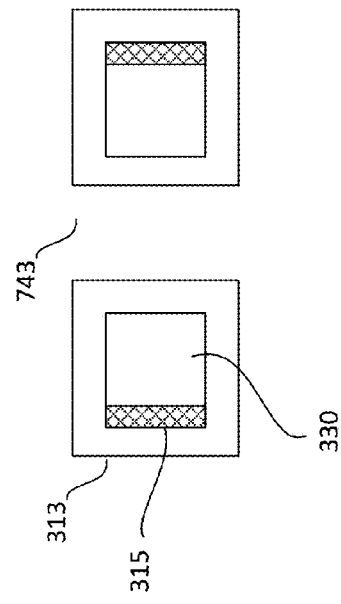

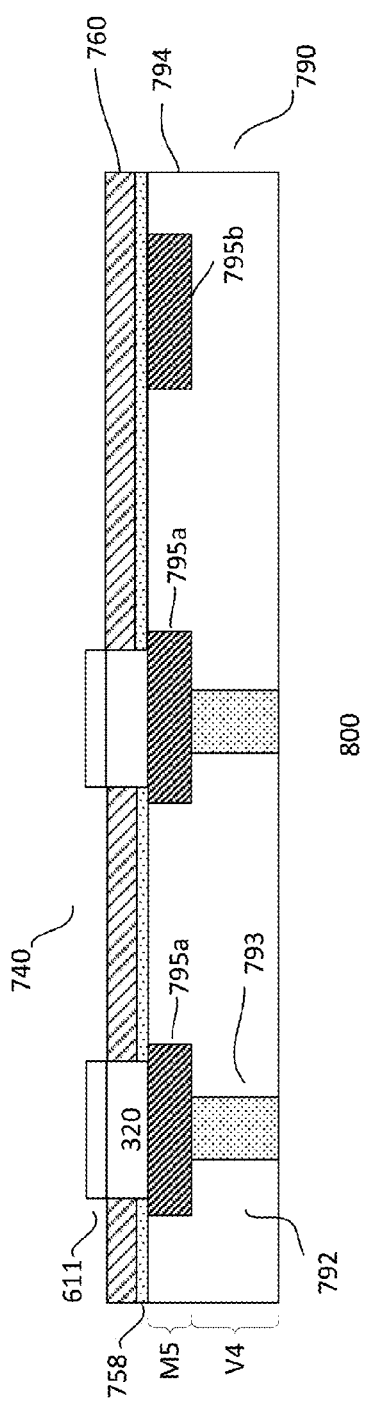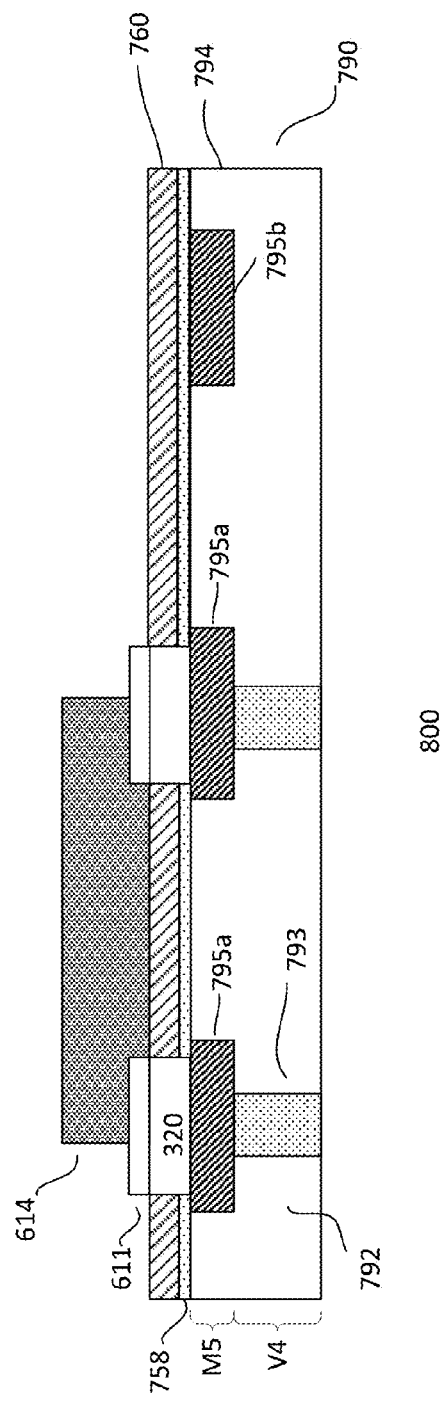
Fig. 8c
Fig. 8d

US 10,388,852 B2

MAGNETIC TUNNEL JUNCTION ELEMENT

BACKGROUND

There are two important requirements for a high density memory cell application, namely the intrinsic critical current (Ic) and thermal stability factor (A). However, satisfying the two important requirements remains a huge challenge due to the trade-off relation of the intrinsic critical current and thermal stability factor.

For example, thermal stability factor of a memory cell improves with increased volume of the memory cell. Such improvement of the thermal stability factor enhances the data retention time of the memory cell. However, an increase in the volume of the memory cell adversely results in an increase in the intrinsic critical current, which is undesirable for high density memory cell application.

Therefore, it is desirable to provide reliable memory devices having a reduced volume so as to achieve critical current scaling for high density memory cell application without sacrificing the thermal stability factor.

SUMMARY

Embodiments of the present disclosure generally relate to semiconductor devices and methods for forming a semiconductor device. In one embodiment, a method for forming a device is disclosed. The method includes providing a substrate having circuit component formed on a substrate surface. Back end of line processing is performed to form an upper inter level dielectric (ILD) layer over the substrate. The upper ILD layer includes a plurality of ILD levels. The method also includes forming a pair of magnetic tunneling junction (MTJ) stacks in between adjacent ILD levels of the upper ILD layer. Each of the MTJ stack includes a fixed layer, a tunneling barrier layer and a free layer. The fixed layer has a first width. The tunneling barrier layer is formed on the fixed layer. The free layer is formed on the tunneling barrier layer. The free layer has a second width. The first width is wider than the second width.

In one embodiment, a device is disclosed. The device includes a substrate having circuit component formed on a substrate surface. An upper inter level dielectric (ILD) layer is disposed over the substrate. The upper ILD layer includes a plurality of ILD levels. The device also includes a pair of magnetic tunneling junction (MTJ) stacks disposed in between adjacent ILD levels of the upper ILD layer. Each of the MTJ stack includes a fixed layer, a tunneling barrier layer and a free layer. The fixed layer has a first width. The tunneling barrier layer is formed on the fixed layer. The free layer is formed on the tunneling barrier layer. The free layer has a second width. The first width is wider than the second width.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

The accompanying drawings, which are incorporated in and form part of the specification in which like numerals designate like parts, illustrate preferred embodiments of the present disclosure and, together with the description, serve to explain the principles of various embodiments of the present disclosure.

FIGS. 8a-8i show simplified cross-sectional views of a process of forming an embodiment of a memory device along the wordline (WL) direction.

DETAILED DESCRIPTION

Embodiments of the present disclosure generally relate to memory cells or devices. In one embodiment, the memory cells are magnetoresistive memory cells. For example, the memory devices may be spin transfer torque magnetoresistive random access memory (STT-MRAM) devices. Magnetoresistive memory cells include magnetic tunneling junction (MTJ) elements. Other suitable types of memory cells may also be useful. Such memory devices, for example, may be incorporated into standalone memory devices including, but not limited to, USB or other types of portable storage units, or integrated circuits (ICs), such as microcontrollers or system on chips (SoCs). The devices or ICs may be incorporated into or used with, for example, consumer electronic products, or relate to other types of devices.

Figure 1A:
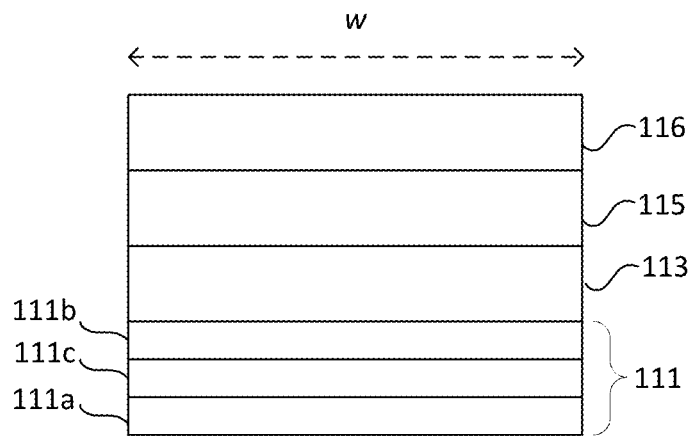
FIGS. 1a and 1b show simplified cross-sectional views of a memory element along the bitline (BL) direction and wordline (WL) direction.
Figure 1B:
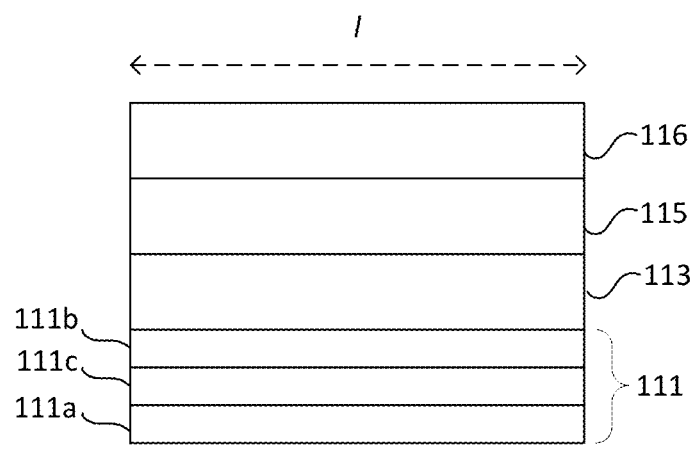

FIGS. 1a and 1b show simplified cross-sectional views of a memory element 100 along the bitline (BL) direction and wordline (WL) direction, respectively. The memory element 100, in one embodiment, includes a magnetic tunnel junction (MTJ) stack sandwiched between a pair of electrodes. The memory element 100, for example, is a magnetoresistive memory cell. The magnetoresistive memory cell may be a Spin Transfer Torque-Magnetoresistive Random Access Memory (STT-MRAM) cell. The electrode pair which includes first and second electrodes (not shown) are provided to the MTJ stack. The first electrode, for example, may be a bottom electrode while the second electrode may be a top electrode. The top and bottom electrodes may be formed of Ta. Other suitable types of electrodes may also be useful. For example, Ti, TaN, TiN or a combination of different electrode materials, including Ta, may also be useful. The MTJ stack is disposed in between the top and bottom electrodes. For example, the bottommost layer of the MTJ stack is disposed on the bottom electrode, while the top electrode is disposed on the uppermost layer of the MTJ stack. Other configurations of electrodes may also be useful.

The MTJ stack 100 is a stack of layers which includes a magnetically fixed (pinned) layer 111, a tunneling barrier layer 113, a free layer 115 and cap layer 116. The MTJ stack 100 may also include a seed layer (not shown) and a bias layer (not shown). The seed layer may be disposed on the bottom electrode and the bias layer may be disposed on the seed layer. The seed layer may be a nickel-based alloy, for example, NiFe or NiCr. Other suitable alloys, apart from nickel-based alloys, may also be useful. The seed layer, for example, enables a smooth growth of the subsequently formed layers in a desired crystallinity. The bias layer may be an antiferromagnetic (AFM) layer. For example, the AFM layer may be metal alloys, such as Pt—Mn or Ir—Mn.

The fixed (pinned) layer 111 is disposed on the bias layer. The fixed (pinned) layer 111 may be a synthetic antiferromagnetic (SAF) layer. The SAF layer may include a first magnetic layer 111a, a second magnetic layer 111b and a coupling layer 111c. The first and second magnetic layers have opposite magnetizations and are separated by the coupling layer 111c. The first magnetic layer 111a is coupled to the bias layer. The coupling layer 111c is disposed on the first magnetic layer 111a and the second magnetic layer 111b is disposed on the coupling layer 111c. Since the magnetic layers are antiparallel coupled, a closure of the magnetic flux is formed within. As a result, stray magnetic field influences on the free layer 115 is minimized.

The magnetizations of the first and second magnetic layers are "pinned" via a direct exchange-bias coupling to the bias layer, so that the magnetization of the first and second magnetic layers does not flip (rotate) in the presence of an applied magnetic field. The magnetization or magnetic orientation in the second magnetic layer proximate to the free layer 115 acts as a fixed reference to the free layer 115.

The first and second magnetic layers of the fixed layer 111 may be an alloy magnetic layer or a multilayer. For example, the magnetic layers may be a cobalt-iron-boron (CoFeB) alloy or a cobalt-iron (CoFe) alloy, or a multilayer of cobalt/platinum (Co/Pt), cobalt/palladium (Co/Pd) or cobalt/nickel (Co/Ni). The first magnetic layer may be thicker than the second magnetic layer to cancel the stray field acted upon the free layer. For example, the first magnetic layer may include n layer of Co/Pt, Co/Pd or Co/Ni, and the second magnetic layer may include m layer of Co/Pt, Co/Pd or Co/Ni, where n is an integer larger than m. In one embodiment, n and m may be less than 20 layers.

The coupling layer 111c may be a non-magnetic conductor. For example, the coupling layer 111c may be a ruthenium (Ru) layer. The Ru layer may be sufficiently thin. The thickness of the Ru layer may be chosen so that there is enough AFM exchange bias existing between the first and second magnetic layers. As a result, the magnetic moment orientation is stabilized in opposite direction.

The tunneling barrier layer 113 is disposed on the fixed (pinned) layer 111. The tunneling barrier layer is a non-magnetic and electrically insulating layer. The tunneling barrier layer may be metal oxides, for example, MgO or $Al_2O_3$. Other metal oxides suitable for used in the MTJ element may also be useful.

The magnetically free layer 115 is disposed on the tunneling barrier layer 113. The magnetic free layer 115 may be a CoFeB layer or a composite layer including CoFeB. The composite layer 115 may include a mono coupling stack or a dual coupling stack. The mono coupling stack includes a coupling layer sandwiched between two magnetic layers, i.e., magnetic layer/coupling layer/magnetic layer configuration. The dual coupling stack includes two mono coupling stacks with a shared magnetic layer in between, i.e., magnetic layer/coupling layer/magnetic layer/coupling layer/magnetic layer configuration. The magnetic layer may be CoFeB and the coupling layer maybe Ru. The thickness of the magnetic layers in the mono coupling stack and dual coupling stack may be substantially the same, whereas the coupling layer may be a thin layer suffices for coupling the magnetic layers.

The cap layer 116 is disposed on the free layer 115. The cap layer 116 may be made of tantalum (Ta). The cap layer 116 protects the underlying free layer 115.

Although the MTJ stack 100 is illustrated as having the various layers as shown in FIGS. 1a-1b, it is to be understood that the MTJ stack may include additional or lesser layers. Other suitable configurations or materials of the MTJ stack may also be useful.

As shown in FIG. 1a, the width w of the various layers of the MTJ element 100 is substantially the same along the bitline (BL) direction. Similarly, the length l of the various layers of the MTJ stack 100 along the wordline (WL) direction is also substantially the same, as shown in FIG. 1b.

There are two important requirements for a high density memory cell application, namely the intrinsic critical current (Ic) and thermal stability factor (Δ). The intrinsic critical current (Ic) of the MTJ element 100 is as follows:

$$I_c \approx \frac{\alpha}{P}\frac{4\pi \cdot e}{\hbar}M_s^2 \cdot V \tag{1}$$

where α denotes the damping constant, P denotes polarization, e denotes the magnitude of electron charge, $\hbar$ denotes the Dirac constant, $M_S$ denotes the saturation magnetization and V denotes the volume of the free layer. The intrinsic critical current (Ic) decreases proportionally with decreasing volume of the free layer, as shown in equation (1). Therefore, a reduction in the volume of the free layer allows for a smaller cell size to be formed and also reduces the intrinsic critical current.

The data retention time of a memory cell defines how long data can be properly kept in the memory cell and it depends significantly on the thermal stability of the MTJ. The thermal stability factor (Δ) of the MTJ is expressed as follows:

$$\Delta = \frac{H_K M_s V}{2k_B T} \sim t\left(\frac{1}{w} - \frac{1}{l}\right)V\frac{M_s^2}{k_B T} \tag{2}$$

where $H_K$ denotes uni-axial anisotropy, $M_S$ is the saturation magnetization, $k_B$ is the Boltzmann constant, V denotes the volume of the free layer, T denotes the absolute temperature, t, w and l respectively denote the thickness, width and length of the free layer. According to equation (2), the thermal stability factor (Δ) increases linearly with increasing volume of the free layer. However, an increase of the volume of the free layer results in an increase in the intrinsic critical current Ic, as shown in equation (1). Therefore, satisfying the two important requirements remains a huge challenge due to the trade-off relation of the intrinsic critical current and thermal stability factor.

Figure 2A:
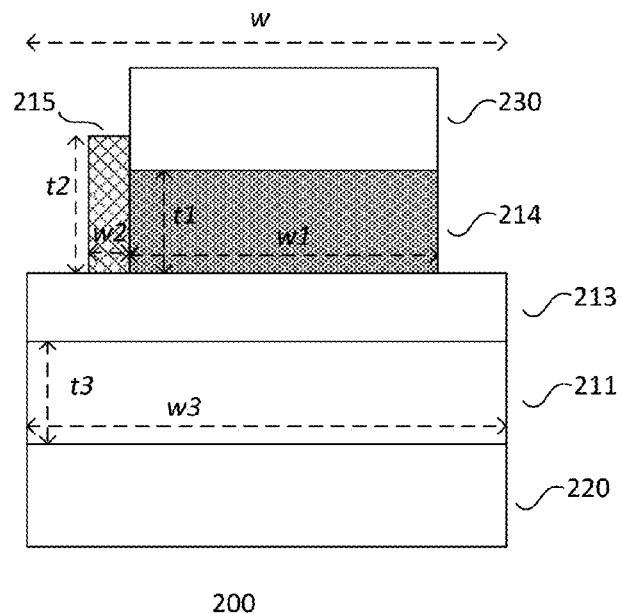
FIGS. 2a and 2b show a simplified cross-sectional view and a simplified front view of a single (individual) stack memory element along the wordline (WL) direction and bitline (BL) direction.
Figure 2B:
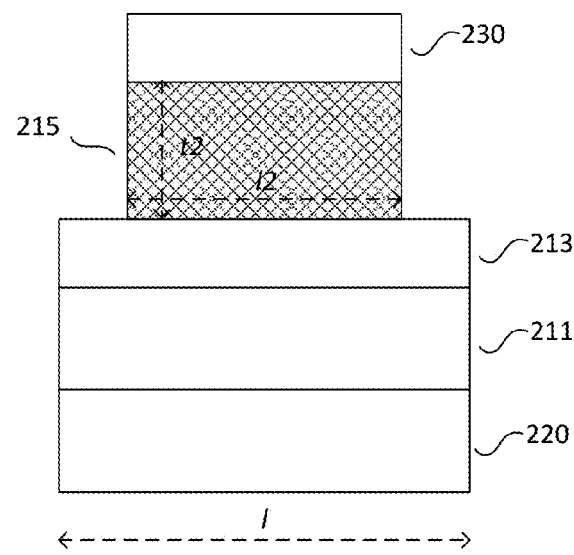

FIGS. 2a and 2b show a simplified cross-sectional view and a simplified front view of a single (individual) stack memory element 200 along the wordline (WL) direction and bitline (BL) direction, respectively. The memory element 200, in one embodiment, includes a magnetic tunnel junction (MTJ) stack sandwiched between bottom and top electrodes. The memory element 200, for example, is a magnetoresistive memory cell. The magnetoresistive memory cell may be a Spin Transfer Torque-Magnetoresistive Random Access Memory (STT-MRAM) cell. The memory element 200, for example, is similar to that described in FIGS. 1a-1b. As such, common elements may not be described or described in detail. As shown in FIGS. 2a and 2b, the memory element 200 includes a bottom electrode 220, a magnetically fixed (pinned) layer 211, a tunneling barrier layer 213, a hard mask layer 214, a free layer 215 and a top electrode 230.

Referring to FIG. 2a, the fixed layer 211 is disposed on the bottom electrode 220. The tunneling barrier layer 213 is disposed on the fixed layer. In one embodiment, the tunneling barrier layer 213 is a thin layer. For example, the thickness of the tunneling barrier layer 213 may be about 1 nm to 3 nm. Other thickness of the tunneling barrier layer may also be useful. The hard mask layer 214 and free layer 215 are disposed on the tunneling barrier layer 213. The hard mask layer 214 may be a dielectric layer, for example, a silicon nitride (SiN) layer. Other suitable dielectric layer may also be used as the hard mask layer. The hard mask layer 214 has a first side and an opposing second side. The free layer 215 has a first side and an opposing second side. The hard mask layer 214 and free layer 215 are abutting each other on one side, for example, a first side of the hard mask layer 214 is abutting a second side of the free layer 215. The hard mask layer 214 has a first width w1 and a first thickness t1. The first width w1 of the hard mask layer 214 may be about 50 nm to 70 nm and the first thickness t1 may be about 10 nm to 20 nm. The free layer 215 has a second width w2 and a second thickness t2. The second width w2 of the free layer 215 may be about 5 nm to 10 nm and the second thickness t2 may be about 15 nm to 20 nm. Other thicknesses and widths of the hard mask layer 214 and free layer 215 may also be useful. In one embodiment, the first width w1 of the hard mask layer 214 is wider than the second width w2 of the free layer 215. The first thickness t1 of the hard mask layer 214, in one embodiment, is less than the second thickness t2 of the free layer 215, such that the first side of the hard mask layer 214 abuts a lower portion of the second side of the free layer 215. A top surface of the free layer 215 is higher than a top surface of the hard mask layer 214.

The fixed layer 211 has a third width w3 and a third thickness t3. The third width w3 of the fixed layer 211 may be about 50 nm to 70 nm and the third thickness t3 may be about 20 nm to 30 nm. Other thickness and width of the fixed layer 211 may also be useful. The third width w3 of the fixed layer 211 defines the width w of the memory element 200. The third width w3, i.e., the width of the memory element, is wider than the second width w2 of the free layer 215 and the first width w1 of the hard mask layer 214. In one embodiment, the third width w3 of the fixed layer is wider than the sum of the widths of the free layer 215 and hard mask layer 214. The third thickness t3 of the fixed layer 211, in one embodiment, is more than the second thickness t2 of the free layer 215.

The top electrode 230 is disposed on the hard mask layer 214. The top electrode 230 has a first side and an opposing second side. The top electrode 230 partially abuts the free layer 215 on one side. For example, a lower part of the first side of the top electrode 230 abuts an upper part of the second side of the free layer 215. A top surface of the free layer 215 is lower than a top surface of the top electrode 230. The top electrode 230 has a width that is substantially the same as the first width w1 of the hard mask layer 214.

As shown in the front view (FIG. 2b) of the memory element 200, the tunneling barrier 213 is disposed on the fixed layer 211 and the free layer 215 is disposed on the tunneling barrier layer 213. The free layer 215 has a second length l2 that is less than the length l of the memory cell 200, which is defined by the length of the fixed layer. In one embodiment, the second length l2 may be about 50 nm to 70 nm and the length l of the memory cell may be about 50 nm to 70 nm. Other lengths of the free layer 215 and memory cell may also be useful. In one embodiment, the top electrode 230 has a length that is substantially the same as the length l2 of the free layer 215.

In conventional scaling to obtain a lower intrinsic critical current, the volume of the free layer is laterally reduced (i.e., a reduction in the width and length), while maintaining the thickness. However, due to the reciprocal of the width and length according to equation (2), a lateral reduction of the volume results in a reduced thermal stability factor, which is undesirable. The free layer 215 of the memory cell 200 has a reduced width, while maintaining the length. As a result, the thermal stability factor increases due to the reciprocal of the width. The configuration of the free layer 215 as described, i.e., reducing the width while maintaining the length, ensures that the volume is reduced for obtaining a lower intrinsic critical current. Furthermore, the configuration of the free layer as described also has less impact on the thermal stability as compared by the conventional scaling which reduces both the width and length. As a result, thermal stability degradation as commonly observed by the conventional free layer scaling can be mitigated.

Figure 3:
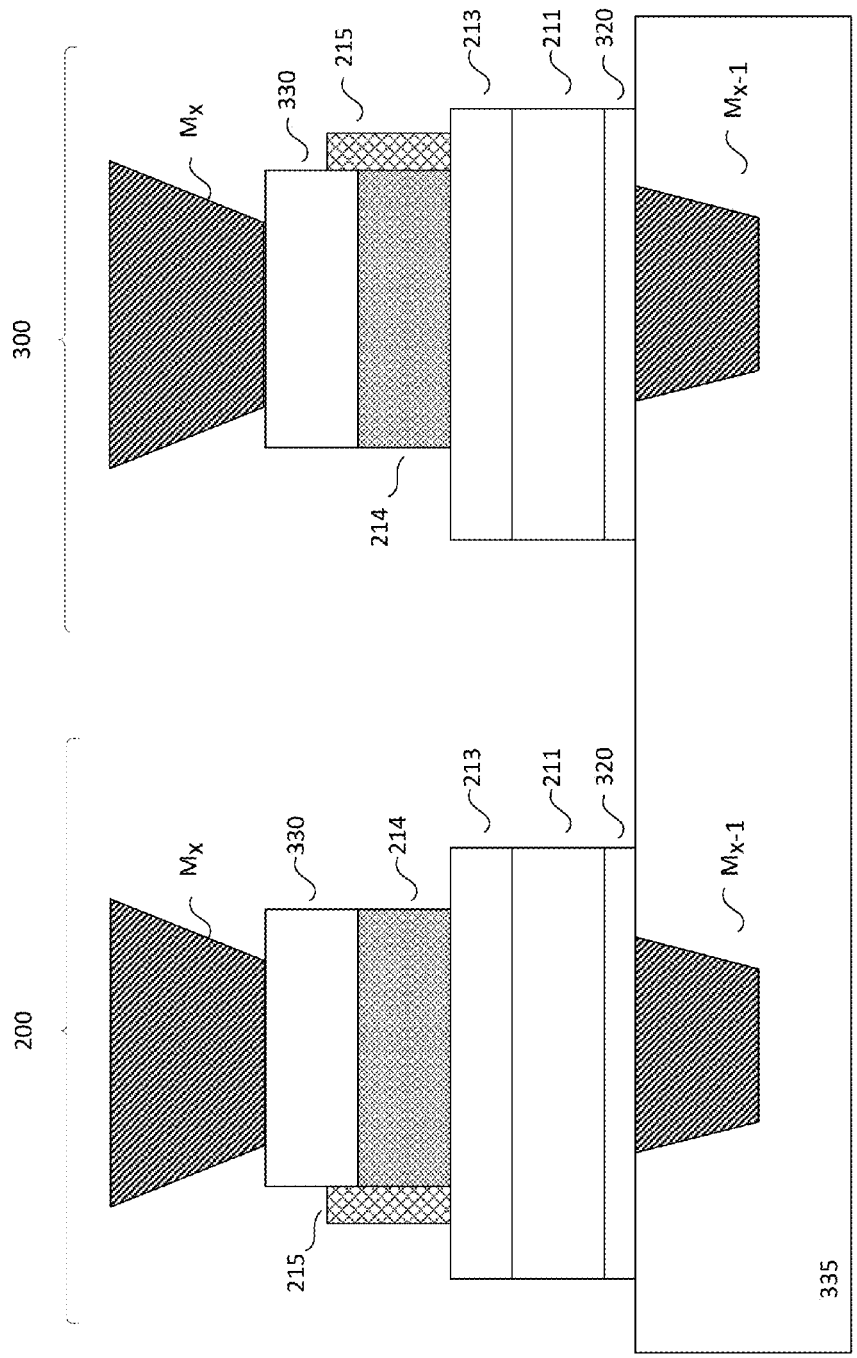
FIG. 3 shows a simplified cross-sectional view of a memory element pair along the wordline (WL) direction.

In one embodiment, an adjacent memory element is configured as a mirror image of the memory element 200. FIG. 3 shows a simplified cross-sectional view of a memory element pair 305 along the wordline (WL) direction. The memory element pair includes a first single stack memory element 200 and a second single stack memory element 300. The first memory element 200, for example, is similar to that described in FIGS. 2a-2b. The second memory element 300 is the mirror image of the first element 200. As such, common elements may not be described or described in detail.

In one embodiment, the memory element pair 305 is disposed in an interlevel dielectric (ILD) level (or layer) over a substrate (not shown). The ILD level is one of ILD levels of a device having a plurality of ILD levels. The number of the ILD levels may depend on, for example, design requirements or the logic process involved. All ILD level includes a metal level and a contact (or via) level. In one embodiment, the memory element pair 305 is disposed in a contact (or via) level of an ILD level. For example, the memory element pair 305 is disposed in the contact level $V_{x-1}$ between metal levels $M_{x-1}$ and $M_x$. The metal level $M_x$ and contact level $V_{x-1}$, in one embodiment, may be the uppermost ILD level. The contact level includes a storage dielectric layer (not shown). The storage dielectric layer may be a dedicated storage dielectric layer disposed over dielectric layer 335 and is not part of an interconnect level. Other configurations of storage dielectric layer may also be useful. The bottom electrode 320 is coupled to a drain of a select transistor (not shown). For example, the bottom electrode 320 is coupled to a contact pad in the M1 level and a via contact in the CA level (i.e., the first contact level of the first ILD level). Other configurations of coupling the bottom electrode may also be useful. The top electrode 330 is coupled to a bitline (BL). For example, the top electrode is coupled to the BL disposed in M2 level. The BL is along a bitline direction. As for the source of the select transistor, it is coupled to a source line (SL). For example, a via contact in CA is provided to couple the source to SL in M1. Providing SL and BL in other suitable metal levels and providing the memory element pair in between any suitable adjacent metal levels may also be useful.

Figure 4A:
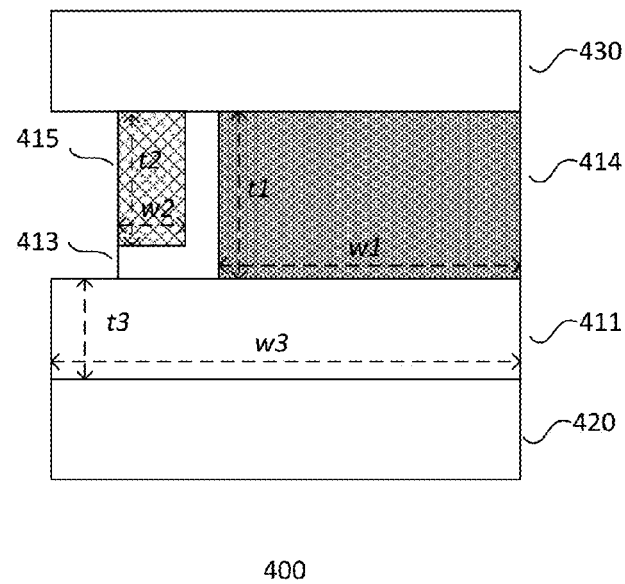
FIGS. 4a and 4b show a simplified cross-sectional view and a simplified front view of a single (individual) stack single memory element along the wordline (WL) direction and bitline (BL) direction.
Figure 4B:
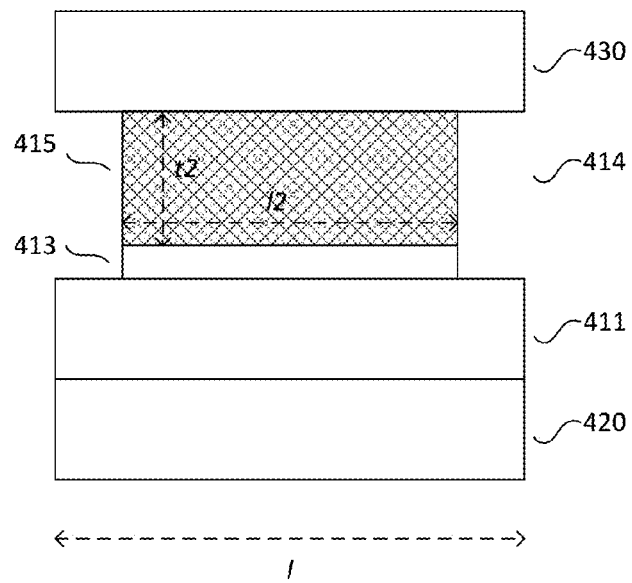

FIGS. 4a and 4b show a simplified cross-sectional view and a simplified front view of another embodiment of a single (individual) stack single memory element 400 along the wordline (WL) direction and bitline (BL) direction, respectively. The memory element 400, in one embodiment, includes a magnetic tunnel junction (MTJ) stack sandwiched between bottom and top electrodes. The memory element 400, for example, is a magnetoresistive memory cell. The magnetoresistive memory cell may be a Spin Transfer Torque-Magnetoresistive Random Access Memory (STT-MRAM) cell. The memory element 400, for example, is similar to that described in FIGS. 1a-1b. As such, common elements may not be described or described in detail. As shown in FIGS. 4a and 4b, the memory element 400 includes a bottom electrode 420, a magnetically fixed (pinned) layer 411, a tunneling barrier layer 413, a hard mask layer 414, a free layer 415 and a top electrode 430.

Referring to FIG. 4a, the fixed layer 411 is disposed on the bottom electrode 420. The tunneling barrier layer 413 is disposed on the fixed layer 411. The tunneling barrier layer 413 and hard mask layer 414 are disposed on the fixed layer 411. The hard mask layer 414 may be a dielectric layer, for example, a silicon nitride (SiN) layer. Other suitable dielectric layer may also be used as the hard mask layer. The hard mask layer 414 has a first side and an opposing second side. The tunneling barrier layer 413 is a horizontally flipped L-shape structure having a vertical portion and a left-extending horizontal portion. The vertical portion has an outer side and an inner side. The left-extending horizontal portion has an upper side and a lower side. The lower side of the left-extending horizontal portion abuts the fixed layer 411. The hard mask layer 414 and tunneling barrier layer 413 are abutting each other on one side. For example, the first side of the hard mask layer 414 is abutting the outer side of the vertical portion of the tunneling barrier layer 413.

The free layer 415 has a first side and an opposing second side. The free layer 415 is disposed on the tunneling barrier layer 413. In one embodiment, the free layer 415 is disposed on the left-extending horizontal portion. The second side of the free layer 415 abuts the inner side of the vertical portion of the tunneling barrier layer 413.

The hard mask layer 414 has a first width w1 and a first thickness t1. The first width w1 of the hard mask layer 414 may be about 50 nm to 80 nm and the first t1 thickness a may be about 10 nm to 20 nm. The free layer 415 has a second width w2 and a second thickness t2. The second width w2 of the free layer 415 may be about 5 nm to 10 nm and the second thickness t2 may be about 15 nm to 20 nm. Other thicknesses and widths of the hard mask layer 414 and free layer 415 may also be useful. In one embodiment, the first width w1 of the hard mask layer 414 is wider than the second width w2 of the free layer 415. The second thickness t2 of the free layer 415 is less than the first thickness a of the hard mask layer 414 due to the presence of the tunneling barrier layer 413 underneath the free layer 415. In one embodiment, the tunneling barrier layer 413 has a uniform thickness. For example, the vertical portion has the same thickness as the left-extending horizontal portion. The thickness of the tunneling barrier layer 413 may be about 1 nm to 3 nm. Other thickness of the tunneling barrier layer may also be useful.

The fixed layer 411 has a third width w3 and a third thickness t3. The third width w3 of the fixed layer 411 may be about 50 nm to 70 nm and the third thickness t3 may be about 20 nm to 30 nm. Other thickness and width of the fixed layer 411 may also be useful. The third width w3 defines the width of the memory element 400. The third width w3 of the fixed layer 411 is wider than the second width w2 of the free layer 415 and the first width w1 of the hard mask layer 414. In one embodiment, the third width w3 of the fixed layer is wider than the sum of the widths of the free layer 415 and hard mask layer 414. The third thickness t3 of the fixed layer 411 is more than the second thickness t2 of the free layer 415.

In one embodiment, the tunneling barrier layer 413, hard mask layer 414 and free layer 415 have a coplanar top surface. The top electrode 430 is disposed on the coplanar top surface of the tunneling barrier layer 413, hard mask layer 414 and free layer 415. The top electrode 430 has a width that is substantially the same as the third width w3 of the fixed layer 411.

As shown in the front view (FIG. 4b) of the memory element 400, the tunneling barrier 413 is disposed on the fixed layer 411 and the free layer 415 is disposed on the tunneling barrier layer 413. The free layer 415 has a second length $l_2$ that is less than the length l of the memory cell 400, which is defined by the length of the fixed layer. In one embodiment, the second length l2 may be about 50 nm to 70 nm and the length l of the memory cell may be about 50 nm to 70 nm. Other lengths of the free layer 415 and memory cell may also be useful. In one embodiment, the top electrode 430 has a length that is substantially the same as the length l2 of the free layer 415.

In conventional scaling to obtain a lower intrinsic critical current, the volume of the free layer is laterally reduced (i.e., a reduction in the width and length), while maintaining the thickness. However, due to the reciprocal of the width and length according to equation (2), a lateral reduction of the volume results in a reduced thermal stability factor, which is undesirable. The free layer 415 of the memory cell 400 has a reduced width, while maintaining the length. As a result, the thermal stability factor increases due to the reciprocal of the width. The configuration of the free layer 415 as described, i.e., reducing the width while maintaining the length, ensures that the volume is reduced for obtaining a lower intrinsic critical current. Furthermore, the configuration of the free layer as described also has less impact on the thermal stability as compared by the conventional scaling which reduces both the width and length. As a result, thermal stability degradation as commonly observed by the conventional free layer scaling can be mitigated.

Figure 5:
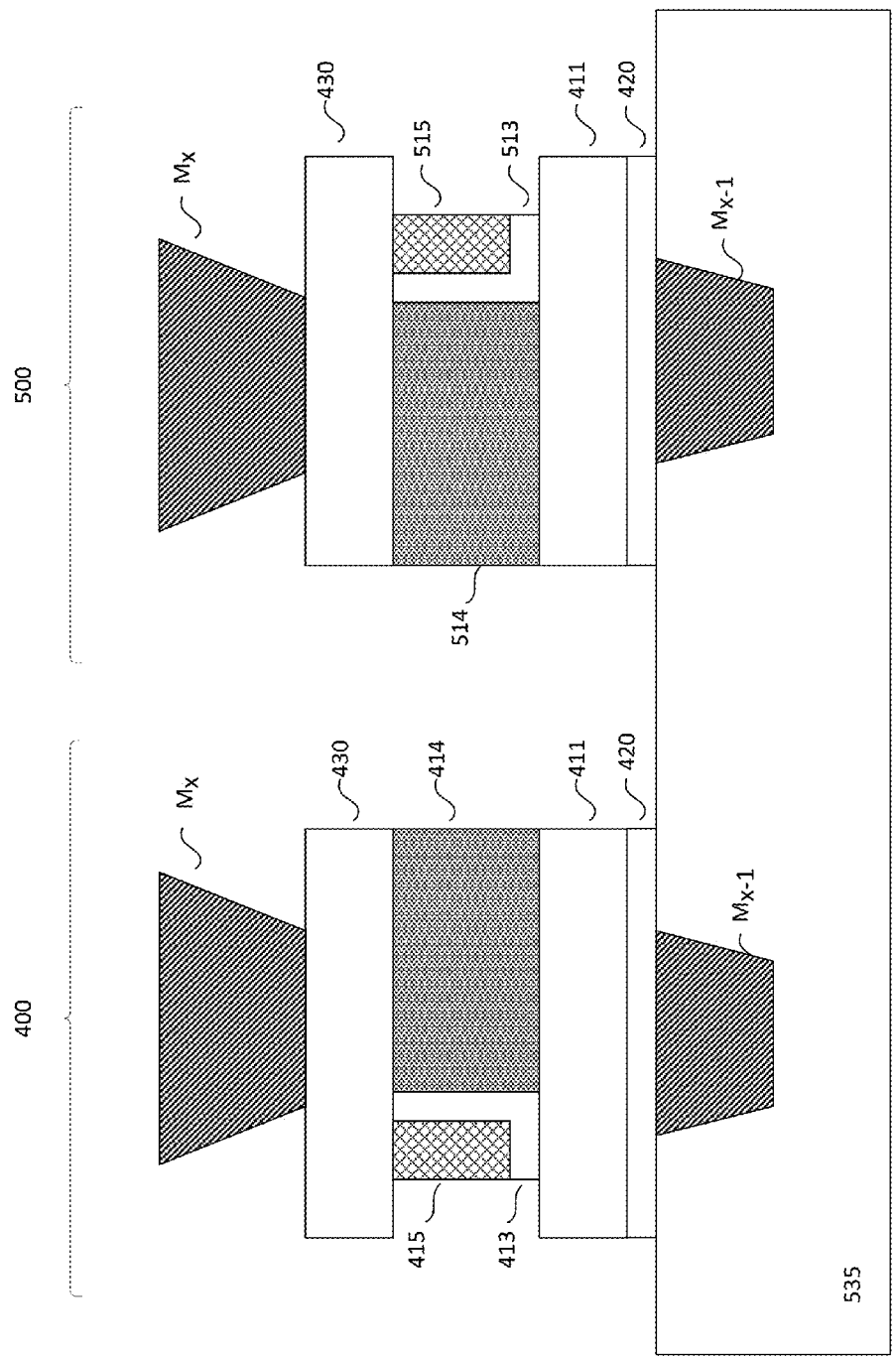
FIG. 5 shows a simplified cross-sectional view of a memory element pair along the wordline (WL) direction.

In one embodiment, an adjacent memory element is configured as a mirror image of the memory element 400. FIG. 5 shows a simplified cross-sectional view of a memory element pair 505 along the wordline (WL) direction. The memory element pair includes a first single stack memory element 400 and a second single stack memory element 500. The first memory element 400, for example, is similar to that described in FIGS. 4a-4b. The second memory element 500 is the mirror image of the first element 400. As such, common elements may not be described or described in detail.

Referring to FIG. 5, the tunneling barrier layer 513 and hard mask layer 514 are disposed on the fixed layer 411. The hard mask layer 514 has a first sidewall and an opposing second sidewall. The tunneling barrier layer 513 is a L-shape structure having a vertical portion and a right-extending horizontal portion. The vertical portion has an outer side and an inner side. The right-extending horizontal portion has an upper side and a lower side. The lower side of the right-extending horizontal portion abuts the fixed layer 411. The hard mask layer 514 and tunneling barrier layer 513 are abutting each other on one side. For example, the second sidewall of the hard mask layer 514 is abutting the outer side of the vertical portion of the tunneling barrier layer 513.

The free layer 515 has a first side and an opposing second side. The free layer 515 is disposed on the tunneling barrier layer 513. In one embodiment, the free layer 515 is disposed on the right-extending horizontal portion. The first side of the free layer 515 abuts the inner side of the vertical portion of the tunneling barrier layer 513. Similar to the memory element 400, the top electrode 430 is disposed on the planar top surface of the hard mask layer 514, tunneling barrier layer 513 and free layer 515.

In one embodiment, the memory element pair 505 is disposed in an interlevel dielectric (ILD) level (or layer) of a substrate (not shown). The ILD level is one of ILD levels of a device having a plurality of ILD levels. The number of the ILD levels may depend on, for example, design requirements or the logic process involved. All ILD level includes a metal level and a contact (or via) level. In one embodiment, the memory element pair 505 is disposed in a contact (or via) level of an ILD level. For example, the memory element pair 505 is disposed in the contact level $V_{x-1}$ between metal levels $M_{x-1}$ and $M_x$. The metal level $M_x$ and contact level $V_{x-1}$, in one embodiment, is the uppermost ILD level. The contact level includes a storage dielectric layer. The storage dielectric layer may be a dedicated storage dielectric layer disposed over dielectric layer 535 and is not part of an interconnect level. Other configurations of storage dielectric layer may also be useful. The bottom electrode 420 is coupled to a drain of a select transistor (not shown). For example, the bottom electrode 420 is coupled to a contact pad in the M1 level and a via contact in the CA level (i.e., the first contact level of the first ILD level). Other configurations of coupling the bottom electrode may also be useful. The top electrode 430 is coupled to a bitline (BL). For example, the top electrode is coupled to the BL disposed in M2 level. The BL is along a bitline direction. As for the source of the select transistor, it is coupled to a source line (SL). For example, a via contact in CA is provided to couple the source to SL in M1. Providing SL and BL in other suitable metal levels and providing the memory element pair in between any suitable adjacent metal levels may also be useful.

Figure 6:
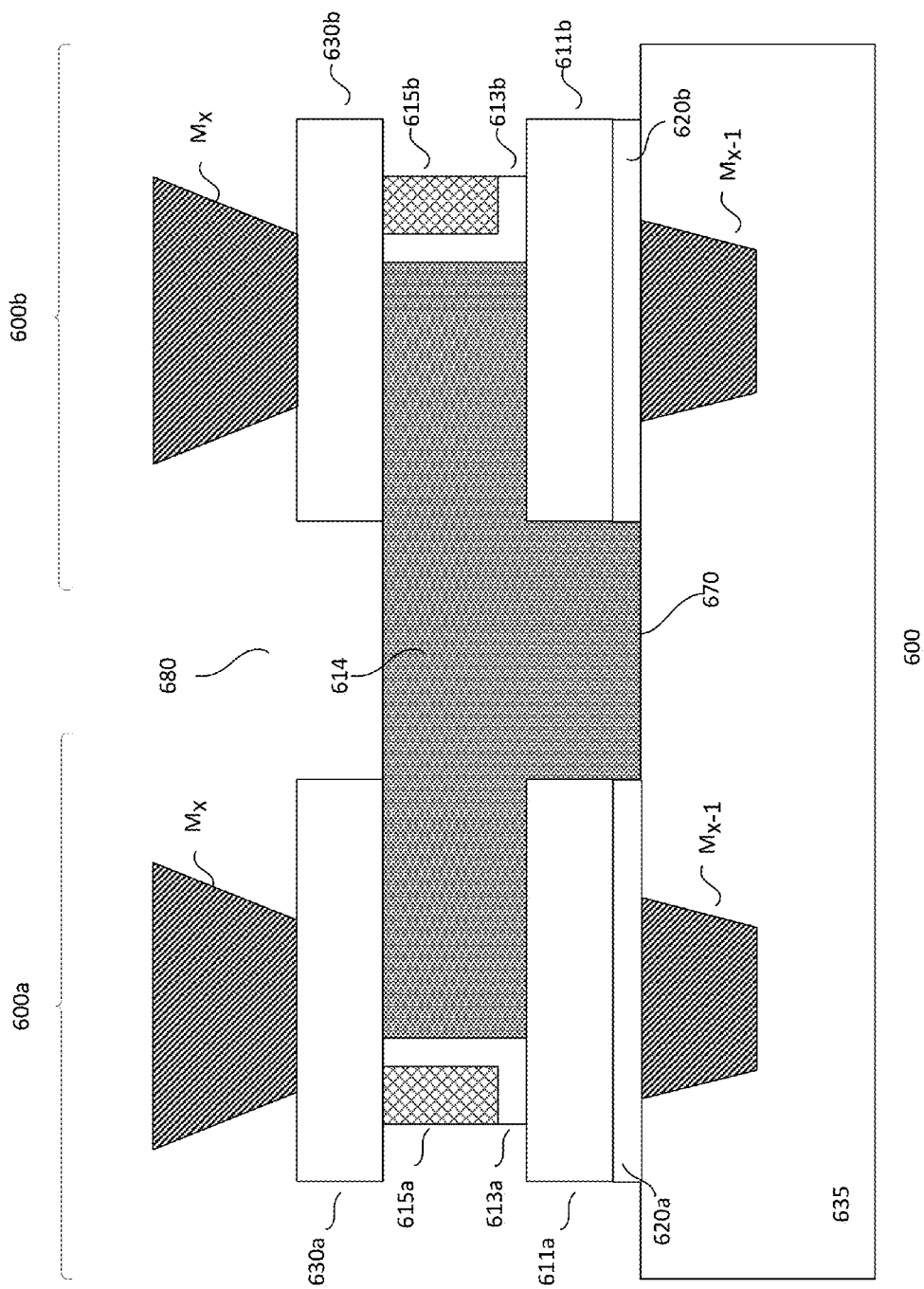
FIG. 6 shows a simplified cross-sectional view of a single stack dual memory element along the wordline (WL) direction.

FIG. 6 shows a simplified cross-sectional view of a single stack dual memory element 600 along the wordline (WL) direction. The single stack dual memory element 600 includes two memory elements. Each of the memory elements, in one embodiment, includes a magnetic tunnel junction (MTJ) sandwiched between a pair of electrodes. The memory element, for example, is a magnetoresistive memory cell. The magnetoresistive memory cell may be a Spin Transfer Torque-Magnetoresistive Random Access Memory (STT-MRAM) cell. The continual memory element 600, for example, is similar to the memory element pair 505 described in FIG. 5. As such, common elements may not be described or described in detail.

As shown in FIG. 6, the single stack dual memory element 600 includes a first memory element 600a and a second memory element 600b. The first memory element 600a is similar to the memory element 400 and the second memory element is similar to the memory element 500. The first memory element 600a includes a first bottom electrode 620a, a first fixed layer 611a, a first tunneling barrier layer 613a, a first free layer 615a and a first top electrode 630a. The second element 600b includes a second bottom electrode 620b, a second fixed layer 611b, a second tunneling barrier layer 613b, a second free layer 615b and a second top electrode 630b. The first and second elements, for example, share a common hard mask layer 614.

Referring to FIG. 6, the first fixed layer 611a and second fixed layer 611b are separated by a first gap 670. In one embodiment, the gap 670 follows the BEOL minimum design rules. For example, the gap is about 40 nm for a metal or via minimum distance of 60 nm to 80 nm. The hard mask layer 614 is disposed over the first fixed layer 611a and second fixed layer 611b. The hard mask 614 includes a first sidewall and an opposing second sidewall. The hard mask layer 614, in one embodiment, is a continuous layer. For example, the first sidewall of the hard mask layer abuts the outer side of the vertical portion of the first tunneling barrier layer 613a and the second sidewall abuts the outer side of the vertical portion of the second tunneling barrier layer 613b. The continuous hard mask layer 614 bridges the first gap 670 between the first fixed layer 611a and second fixed layer 611b. For example, a middle portion of the hard mark layer 614 fills the first gap 670 between the first fixed layer 611a and second fixed layer 611b. The hard mask layer 614, being a dielectric layer (e.g., a silicon nitride layer), isolates the first memory element 600a and second memory element 600b. In one embodiment, the width of the hard mask layer may be about 150 nm to 250 nm. Other suitable width of the hard mask layer may also be useful.

In one embodiment, the first tunneling barrier layer 613a, second tunneling barrier layer 613b, hard mask layer 614, first free layer 615a and second free layer 615b have a coplanar top surface. The first top electrode 630a and second top electrode 630b are disposed on the coplanar top surface. The first top electrode 630a and second top electrode 630b are separated by a second gap 680. The second gap 680, in one embodiment, is aligned with the first gap 670 separating the first and second fixed layers 611a and 611b. The first top electrode 630a is aligned with the first fixed layer 611a, while the second top electrode 630b is aligned with the second fixed layer 611b.

In one embodiment, the single stack dual memory element 600 is disposed in an interlevel dielectric (ILD) level (or layer) of a substrate (not shown). The ILD level is one of ILD levels of a device having a plurality of ILD levels. The number of the ILD levels may depend on, for example, design requirements or the logic process involved. All ILD level includes a metal level and a contact (or via) level. In one embodiment, the single stack dual memory element 600 is disposed in a contact (or via) level of an ILD level. For example, the single stack dual memory element 600 is disposed in the contact level $V_{x-1}$ between metal levels $M_{x-1}$ and $M_x$. The metal level $M_x$ and contact level $V_{x-1}$, in one embodiment, correspond to the uppermost ILD level. The contact level includes a storage dielectric layer. The storage dielectric layer may be a dedicated storage dielectric layer disposed over dielectric layer 635 and is not part of an interconnect level. Other configurations of storage dielectric layer may also be useful. The bottom electrode 620 is coupled to a drain of a select transistor (not shown). For example, the bottom electrode 620 is coupled to a contact pad in the M1 level and a via contact in the CA level (i.e., the first contact level of the first ILD level). Other configurations of coupling the bottom electrode may also be useful. The top electrode 630 is coupled to a bitline (BL). For example, the top electrode is coupled to the BL disposed in M2 level. The BL is along a bitline direction. As for the source of the select transistor, it is coupled to a source line (SL). For example, a via contact in CA is provided to couple the source to SL in M1. Providing SL and BL in other suitable metal levels and providing the memory element pair in between any suitable adjacent metal levels may also be useful.

In conventional scaling to obtain a lower intrinsic critical current, the volume of the free layer is laterally reduced (i.e., a reduction in the width and length), while maintaining the thickness. However, due to the reciprocal of the width and length according to equation (2), a lateral reduction of the volume results in a reduced thermal stability factor, which is undesirable. The free layers of the single stack dual memory element 600 have a reduced width, while maintaining the length. As a result, the thermal stability factor increases due to the reciprocal of the width. The configuration of the free layers as described, i.e., reducing the width while maintaining the length, ensures that the volume is reduced for obtaining a lower intrinsic critical current. Furthermore, the configuration of the free layer as described also has less impact on the thermal stability as compared by the conventional scaling which reduces both the width and length. As a result, thermal stability degradation as commonly observed by the conventional free layer scaling can be mitigated.

Figure 7C:
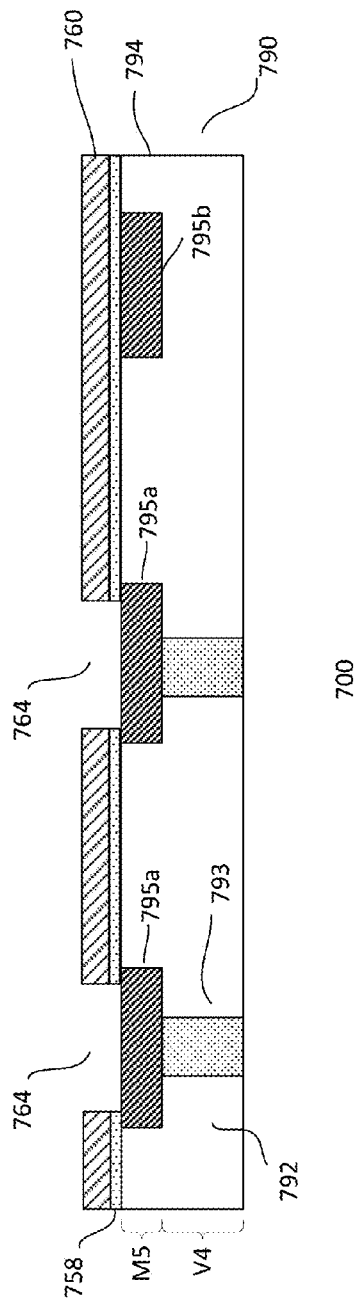
FIGS. 7a-7o show simplified cross-sectional views of a process of forming an embodiment of a memory device along the wordline (WL) direction.
Figure 7D:
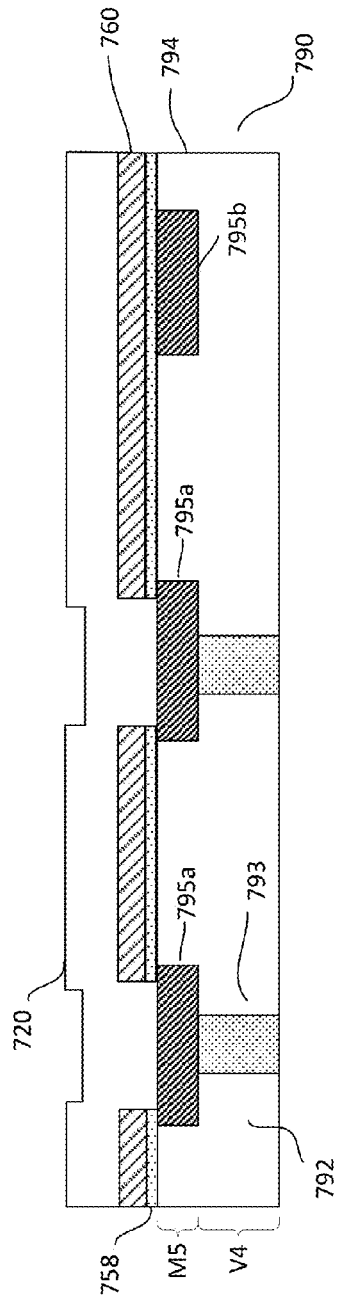
Figure 7E:
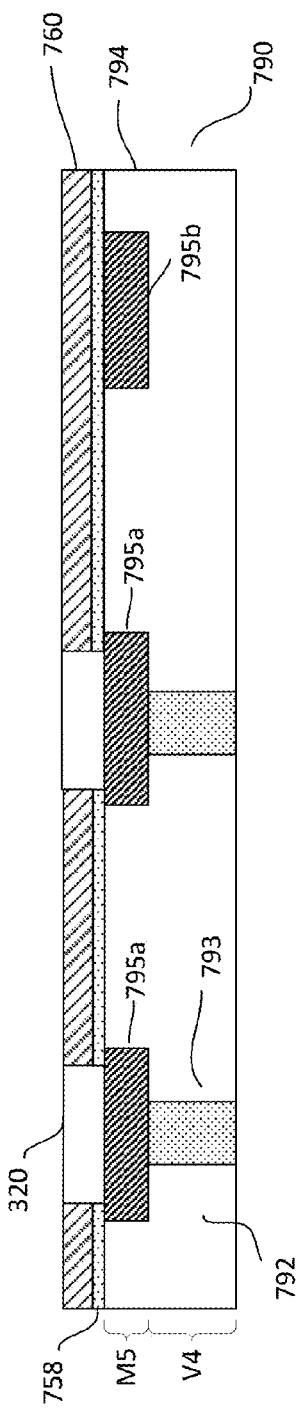
Figure 7F:
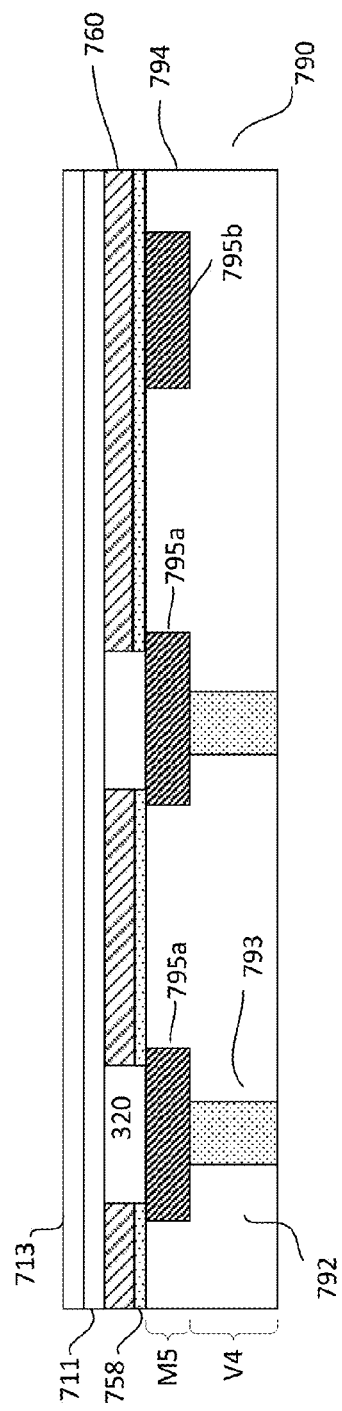
Figure 7G:
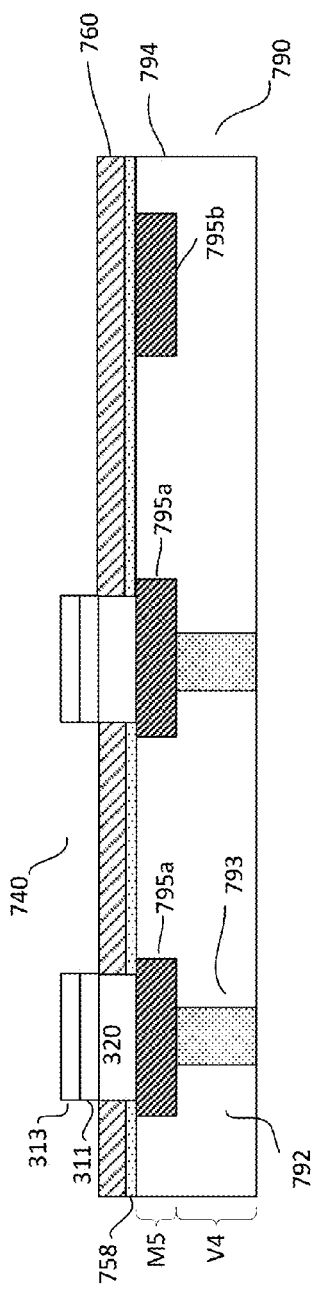
Figure 7H:
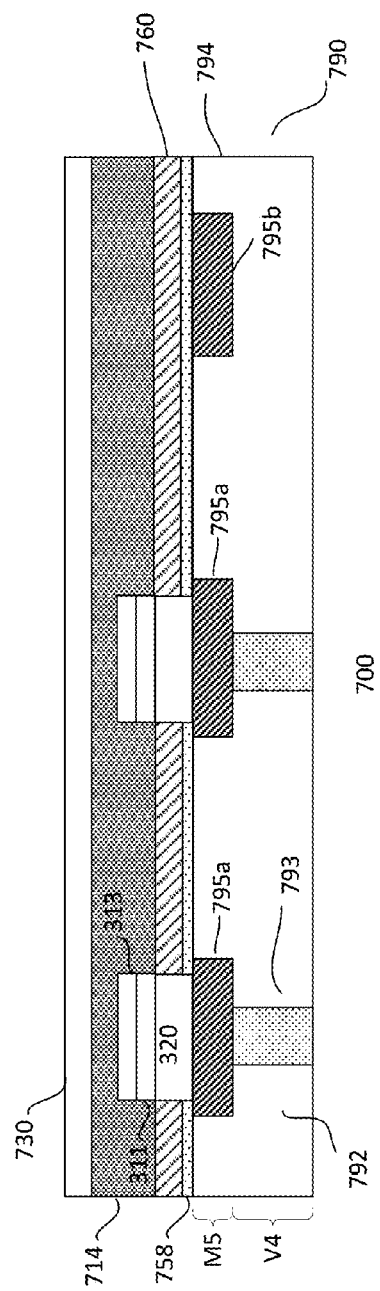
Figure 7I:
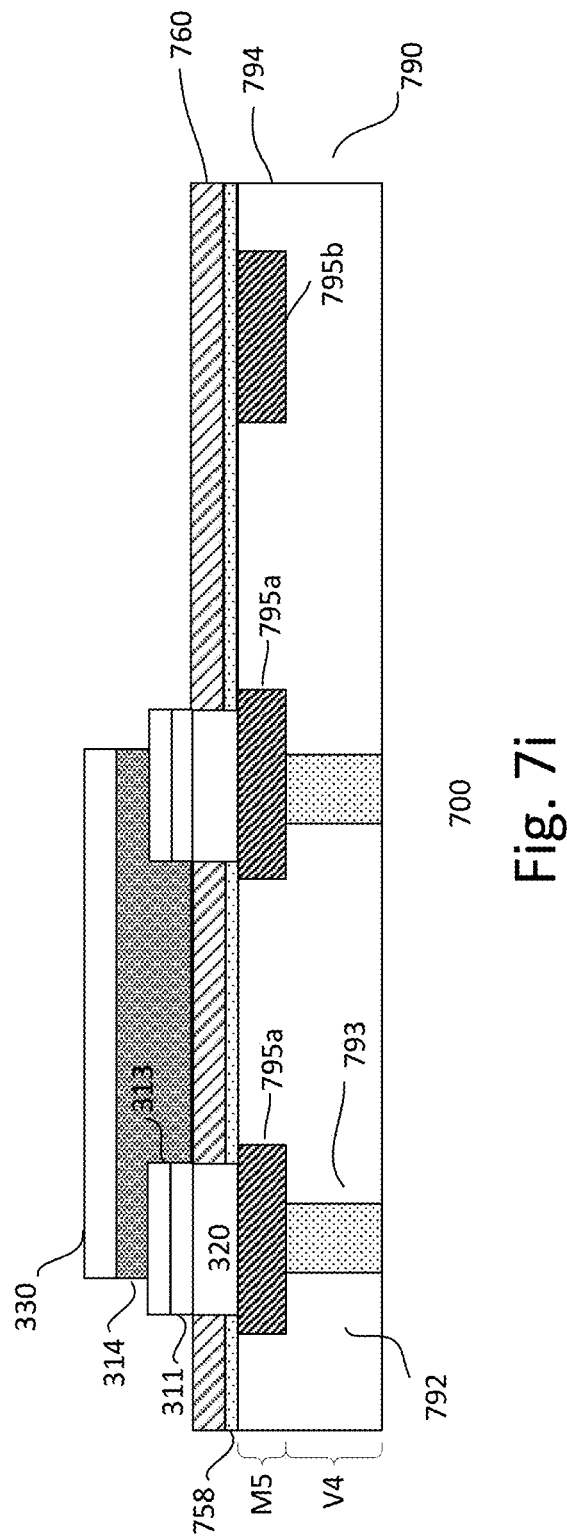
Figure 7J:
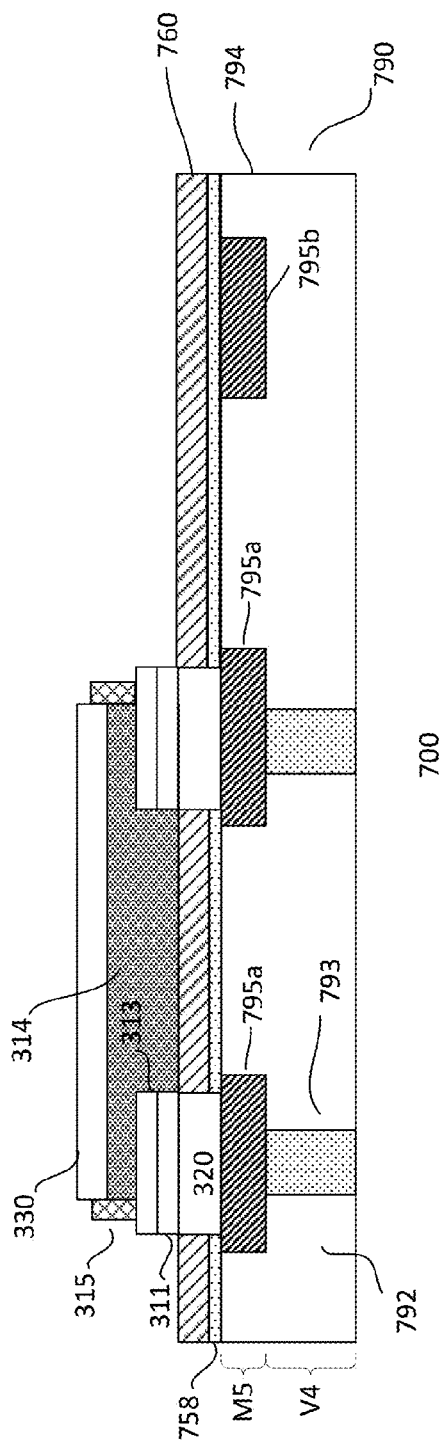
Figure 7K:
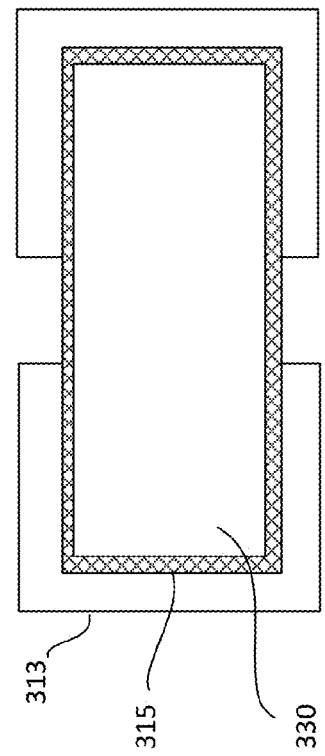
Figure 7N:
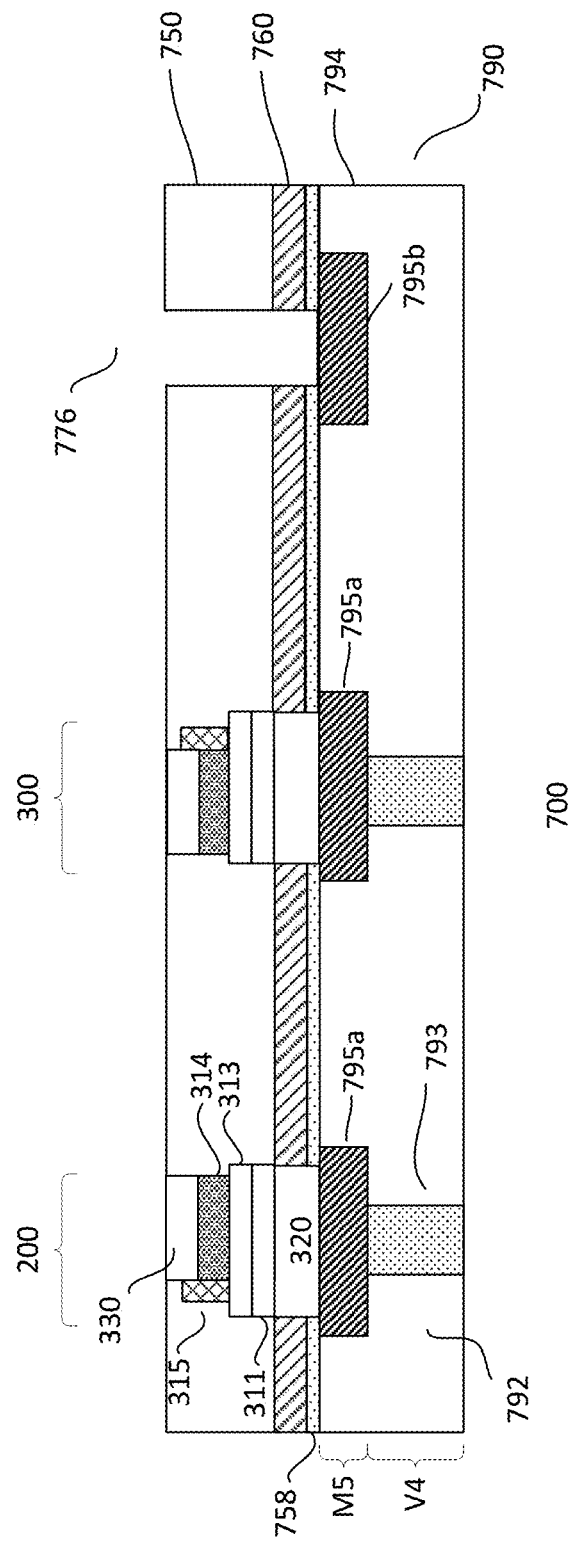
Figure 7O:
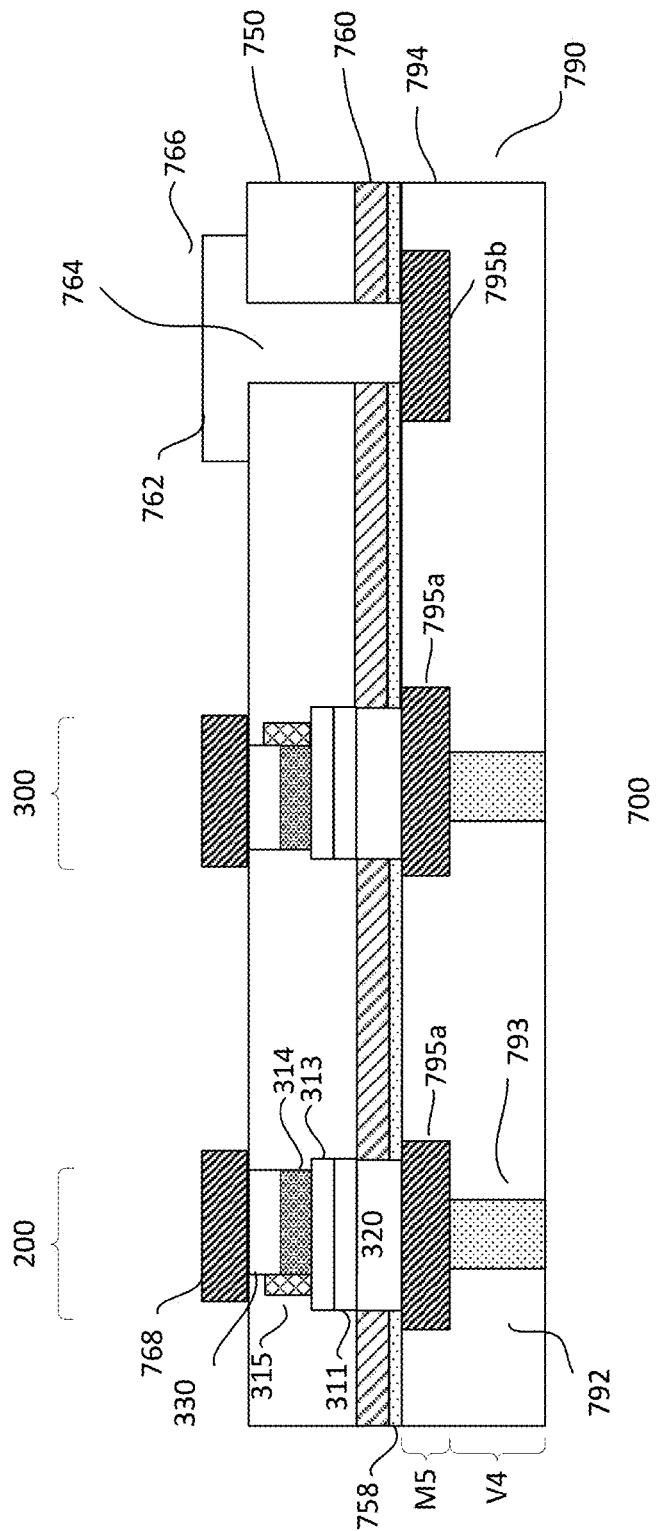

FIGS. 7a-7o show simplified cross-sectional views of a process 700 of forming an embodiment of a memory device along the wordline (WL) direction. The device formed by process 700 includes a memory element pair. The memory element pair includes a first single stack memory element and a second single stack memory element. The memory element pair, for example, is similar to that described in FIG. 3. Common elements may not be described or described in detail. Each of the memory element, in one embodiment, includes a magnetic tunnel junction (MTJ) stack sandwiched between bottom and top electrodes. The memory element, for example, is a magnetoresistive memory cell. The magnetoresistive memory cell may be a Spin Transfer Torque-Magnetoresistive Random Access Memory (STT-MRAM) cell.

Although the cross-sectional views show two memory elements, it is understood that the device includes a plurality of memory elements of, for example, a memory array. In addition, the memory elements can be formed simultaneously with CMOS logic devices on the same substrate.

The simplified cross-sectional views illustrate an ILD level 790. For example, a substrate (not shown) has been processed with FEOL and BEOL processing to include the ILD level. FEOL processing, for example, forms transistors, including a select transistor of the memory cell. Other types of devices may also be formed on the same substrate. BEOL processing forms interconnects in ILD levels. The FEOL and part of the BEOL processing will not be illustrated. The substrate (not shown), for example, is processed up to the stage where an ILD level 790 which includes a via level 792 and a metal level 794 is formed. For example, the ILD level 790 includes V4 and M5. The via level V4 includes via contacts 793. The metal level, as shown, includes interconnects. For example, an interconnect 795a is a cell contact pad for coupling to a memory element and an interconnect 795b for coupling to a pad interconnect. The interconnects, for example, are copper interconnects. Other suitable types of interconnects may also be useful.

Referring to FIG. 7a, a dielectric liner 758, in one embodiment, is disposed above the metal level M5. The dielectric liner, for example, serves as an etch stop layer. The dielectric liner may be a low k dielectric liner. For example, the dielectric liner may be nBLOK. Other types of dielectric materials for the dielectric liner may also be useful. The dielectric liner, for example, is formed by CVD. Other suitable techniques for forming the dielectric liner may also be useful.

The process continues to form a dielectric layer 760. As shown in FIG. 7b, a dielectric layer 760 is formed on the ILD level 790. For example, the dielectric layer is formed on the dielectric liner 758. The dielectric layer, for example, may be formed by CVD. Other suitable forming techniques or suitable thicknesses for the dielectric layer may also be useful.

In FIG. 7c, the dielectric layer is patterned to form memory element opening 764. The memory element opening 764, for example, is a via opening for accommodating a lower portion of a subsequently formed memory element stack. The memory element opening exposes a cell contact pad 795a in the metal level below. The opening may be formed by mask and etch techniques. For example, a patterned photoresist mask may be formed over the dielectric layer, serving as an etch mask. An etch, such as RIE, may be performed to pattern the dielectric layer using the patterned resist etch mask. In one embodiment, the etch transfers the pattern of the mask to the dielectric layer, including the dielectric liner to expose the cell contact pad below.

Referring to FIG. 7d, the process continues to form memory element stacks. The memory element stacks may be magnetic storage stacks. The magnetic storage stacks are, for example, the MTJ stacks, similar to that describe in FIG. 3. Each of the MTJ stack may include various layers configured as a top-pinned or bottom-pinned MTJ stack. Each of the MTJ stack forms a storage unit of a MRAM cell.

The MTJ stack, for example, is disposed between top and bottom electrodes. The bottom electrode is coupled to a contact pad in the metal level below. For example, the bottom electrode is coupled to the contact pad 795a in M5. This provides connections of the MTJ stack to a first S/D region of a cell select transistor. As for the top electrode, it is exposed over the top surface of the MTJ stack.

The various layers of the MTJ stack are formed on the substrate. For example, the various layers of the MTJ stack are sequentially formed over the dielectric layer and filling the openings. After the openings 764 are formed, a bottom electrode layer 720, such as Ta or TaN is deposited over the dielectric layer and fills the openings as shown in FIG. 7d. A chemical mechanical polishing (CMP) process is applied to form an embedded bottom electrode in the opening 764 and remove excess bottom electrode layer in other areas. Other suitable bottom electrode materials and techniques may be employed. The bottom electrode 320 fills the opening and the surface is flat as shown in FIG. 7e.

As shown in FIG. 7f, a fixed layer 711 and a tunneling barrier layer 713 are sequentially formed on the uppermost dielectric layer. For example, the fixed layer 711 is formed on the dielectric layer 760 and the tunneling barrier layer 713 is subsequently formed on the fixed layer 711. The layers may be formed by physical vapor deposition (PVD) process.

In FIG. 7g, the layers are patterned by mask and etch techniques to form two stacks of fixed layer 311 and tunneling barrier layer 313. For example, a first lithography mask may be used to pattern a photoresist layer that is formed over the tunneling barrier layer 713. The patterned photoresist layer serves as an etch mask. An etch, such as RIE, may be performed to pattern the layers using the patterned resist as an etch mask. The first stack of patterned fixed layer 311 and tunneling barrier layer 313 is separated from the second stack of patterned fixed layer 311 and tunneling barrier layer 313 by a first gap 740.

As shown in FIG. 7h, a hard mask layer 714 is formed over the dielectric layer 760, covering the patterned fixed layer 311 and tunneling barrier layer 313. The hard mask layer 714 fills the gaps 740 between the two stacks of patterned fixed layer and tunneling barrier layer. A top electrode layer 730 is subsequently formed on the hard mask layer 714. The layers may be formed by PVD process.

The layers are patterned by mask and etch technique to form a hard mask layer 314 and a top electrode 330 as shown in FIG. 7i. For example, a second lithography mask may be used to pattern a photoresist layer that is formed over the top electrode layer 730. The patterned photoresist layer serves as an etch mask. An etch, such as RIE, may be performed to pattern the layers using the patterned resist. The patterned layers have sidewalls that are displaced from the sidewalls of the patterned fixed layer 311 and tunneling barrier layer 313, such that the outer portions of the tunneling barrier layer 313 of the first and second stacks are exposed. The patterned layers also bridge the two stacks, such that the first gap 740 remains filled by the hard mask layer.

A conformal free layer is formed over the patterned layers. The conformal free layer is formed by a PVD process. The conformal free layer is subsequently patterned to form free layer 315 in the form of spacer on the sidewalls of the hard mask layer 314 and top electrode 330, as well as on a portion of the outer portions of the tunneling barrier layer 313. An anisotropic etch, such as RIE, may be used to remove horizontal portions of the conformal free layer, leaving free layer 315 in the form of spacer on the sidewalls of the hard mask layer 314 and top electrode layer 330. In one embodiment, the top surface of the free layer 315 is below the top surface of the top electrode 330 but above the upper surface of the hard mask layer 314, as shown in FIG. 7j. A corresponding top view of the partially processed device is shown in FIG. 7k. For the purpose of illustration, the substrate is omitted. As shown, the free layer 315 surrounds the perimeter of the patterned stack which includes the hard mask layer 314 and top electrode layer 330, leaving outer edges of the tunneling barrier layer 313 exposed.

As shown in FIG. 7l, the layers, except the fixed layer 311 and tunneling barrier layer 313, are further patterned to form individual memory elements. The layers are patterned by mask and etch techniques to form a first memory element 200 and a second memory element 300. For example, a third lithography mask may be used to pattern a photoresist layer that is formed over the layers of the memory elements. The patterned photoresist layer serves as an etch mask. An etch, such as RIE, may be performed to pattern the layers using the patterned resist etch mask. The first memory element 200, for example, is similar to that described in FIGS. 2a-2b. The second memory element 300, for example, is the mirror image of the first memory element 200. A corresponding top view of the partially processed device is shown in FIG. 7m. For the purpose of illustration, the substrate is omitted. As shown, the first and second memory elements are separated by a second gap 743 which is substantially the same as the first gap 740 and the patterned free layers 315 of the individual memory elements are in the form of spacers disposed on a sidewall of the hard mask layer 314.

A dielectric layer 750 is formed on the substrate, as shown in FIG. 7n. The dielectric layer 750 is formed over the dielectric layer 760 and sufficiently covers the memory elements. The dielectric layer 750, for example, is silicon oxide. Other types of dielectric layers may also be useful. The dielectric layer may be formed by CVD. Other techniques for forming the dielectric layer may also be useful. The dielectric layer 750 and dielectric layer 760 correspond to a storage dielectric layer.

A planarizing process is performed on the substrate, planarizing the dielectric layer 750. The planarizing process, for example, is a CMP process. The CMP produces a planar top surface between the top of the memory elements and dielectric layer 750.

The dielectric layers and the dielectric liner are patterned to form a via opening 776 at the logic region. The via opening is patterned by mask and etch techniques. The via opening penetrates through the various dielectric layers. This exposes the interconnect 795b in the lower metal level. After forming the via opening, the mask layer is removed. For example, the mask and ARC layers are removed.

Referring to FIG. 7o, a conductive layer is formed on the substrate. The conductive layer covers the dielectric layer and MTJ stacks as well as filling the via opening. In one embodiment, the conductive layer is a copper layer. For example, the copper layer is used to form metal line and/or interconnect pads. Other suitable types of conductive layers may also be useful. The conductive layer may be formed by, for example, sputtering. Other suitable techniques for forming the conductive layer may also be useful.

The conductive layer is patterned to form metal lines 768 and interconnect 762. Patterning the conductive layer to form the metal lines and interconnect may be achieved by mask and etch techniques. For example, a patterned photoresist mask may be formed over the conductive layer. An etch, such as RIE, may be used to pattern the conductive layer with a patterned resist mask. In one embodiment, the interconnect 762 includes a via contact 764 in the via opening and a contact pad 766. The metal line 768, for example, serves as the bitline BL. After patterning the conductive layer, the mask layer is removed. For example, the mask and ARC layers are removed.

Additional processes may be performed to complete forming the device. For example, the processes may include forming additional ILD levels, pad level, passivation level, pad opening, dicing, assembly and testing. Other types of processes may also be performed.

FIGS. 8a-8i show simplified cross-sectional views of a process 800 of forming an embodiment of a memory device along the wordline (WL) direction. The device formed by process 800 includes a single stack dual memory element. The single stack dual memory element includes a first memory element 600a and a second memory element 600b, similar to those described in FIG. 6. Common elements may not be described or described in detail. The process may contain similar elements or process steps as the process 700 described in FIGS. 7a-7o. As such, the common elements or process steps may not be described or described in detail.

Each of the memory element, in one embodiment, includes a magnetic tunnel junction (MTJ) stack sandwiched between bottom and top electrodes. The memory element, for example, is a magnetoresistive memory cell. The magnetoresistive memory cell may be a Spin Transfer Torque-Magnetoresistive Random Access Memory (STT-MRAM) cell.

Although the cross-sectional views show two memory elements, it is understood that the device includes a plurality of memory elements of, for example, a memory array. In addition, the memory elements can be formed simultaneously with CMOS logic devices on the same substrate.

Figure 8A:
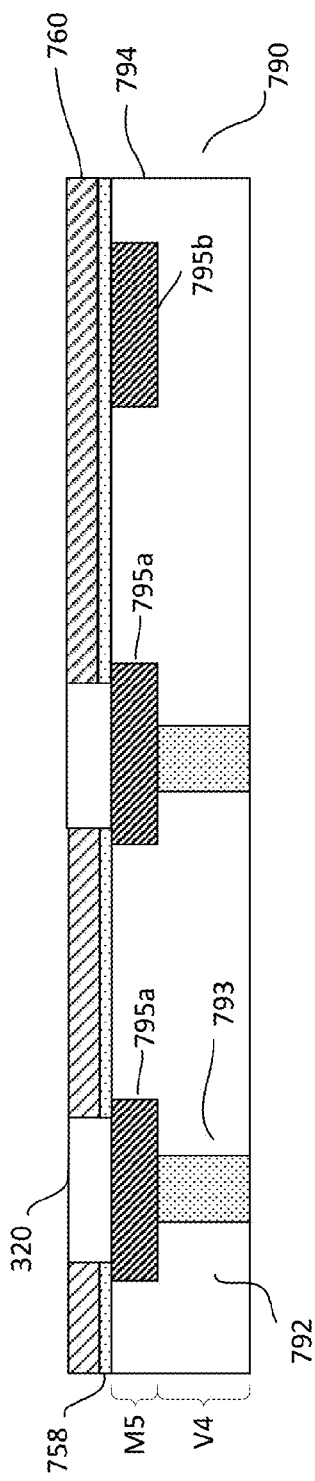

Referring to FIG. 8a, a partially processed device is provided. The device, as shown, is at the stage of processing as described in FIG. 7e. For example, a bottom electrode 320 fills the opening and the surface is flat.

Figure 8B:
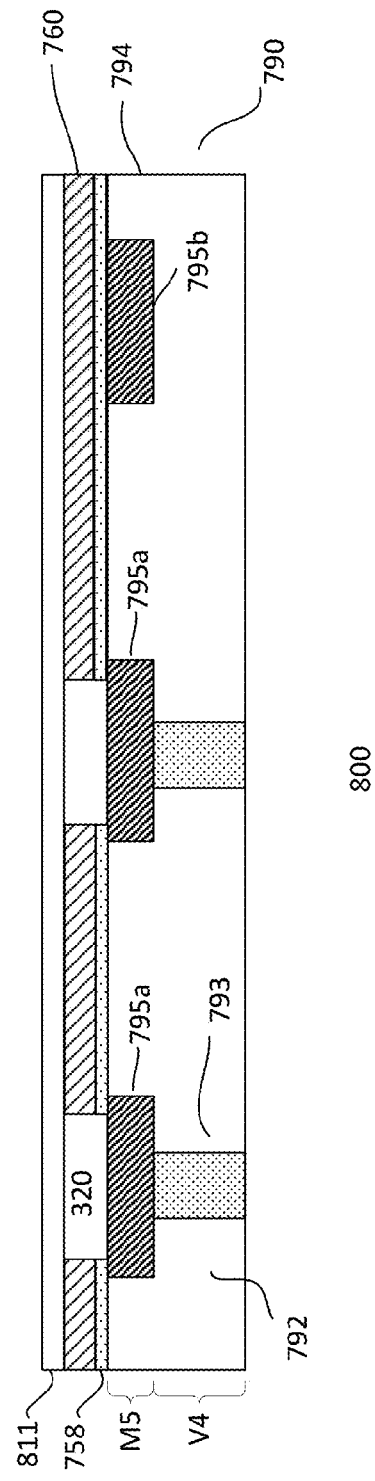

As shown in FIG. 8b, a fixed layer 811 is formed on the uppermost dielectric layer. For example, the fixed layer 811 is formed on the dielectric layer 760. The layer may be formed by physical vapor deposition (PVD) process.

In FIG. 8c, the fixed layer 811 is patterned by mask and etch techniques to form two stacks of fixed layer 611. For example, a first lithography mask may be used to pattern a photoresist layer that is formed over the fixed layer 811. The patterned photoresist layer serves as an etch mask. An etch, such as RIE, may be performed to pattern the layer using the patterned resist etch mask. The first stack of patterned fixed layer 611 is separated from the second stack of patterned fixed layer 611 by a gap 740.

As shown in FIG. 8d, a hard mask layer is formed over the dielectric layer 760, covering the patterned fixed layer 611. The hard mask layer may be formed by PVD process. The hard mask layer fills the gap 740 between the two stacks of patterned fixed layer 611. The hard mask layer is patterned by mask and etch to form a patterned hard mask layer 614. The sidewalls of the patterned hard mask layer 614 are displaced from the sidewalls of the patterned fixed layer 611, such that outer portions of the patterned fixed layers are exposed. For example, a second lithography mask may be used to pattern a photoresist layer that is formed over the hard mask layer. The patterned photoresist layer serves as an etch mask. An etch, such as RIE, may be performed to pattern the hard mask layer using the patterned resist mask.

Figure 8E:
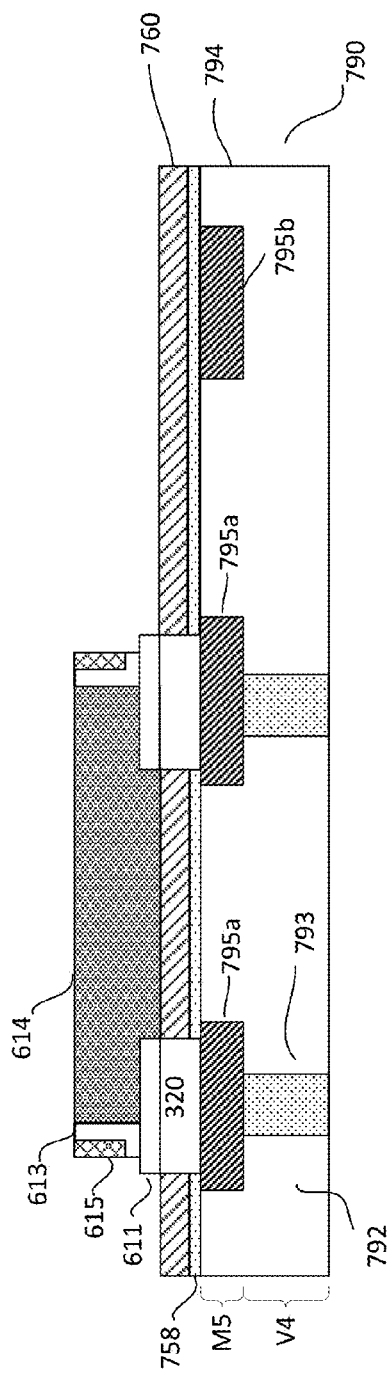

A tunneling barrier layer is formed on the dielectric layer 760. For example, the tunneling barrier layer is formed on the dielectric layer 760, covering the patterned fixed layer 611 and patterned hard mask layer 614. The layer may be formed by PVD process. In one embodiment, the tunneling barrier layer is a conformal layer. The thickness of the conformal tunneling barrier layer is uniform over vertical and horizontal surfaces. A conformal free layer is subsequently formed on the tunneling barrier layer, for example, by PVD. An anisotropic etch, such as RIE, may be used to remove the free layer and tunneling barrier layer, forming an L-shaped tunneling barrier layer and a free layer in the form of spacer 615 on the sidewalls of the L-shaped tunneling barrier layer. Due to the presence of the free layer spacer 615, the patterned tunneling barrier layer 613 resembles an L-shape structure on one side of the hard mask layer 614 and a horizontally flipped L-shape structure on the opposing side of the hard mask layer 614, as shown in FIG. 8e.

Figure 8F:
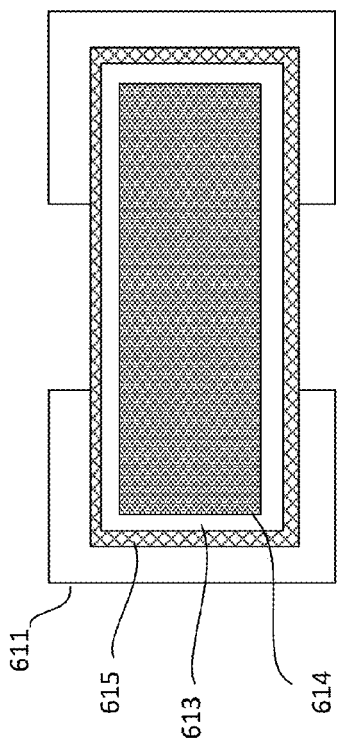

A corresponding top view of the partially processed device is shown in FIG. 8f. As shown, the tunneling barrier layer 613 surrounds the perimeter of the hard mask layer 614, while the free layer 615 surrounds the perimeter of the tunneling barrier layer 613, leaving the fixed layer 611 exposed.

Figure 8G:
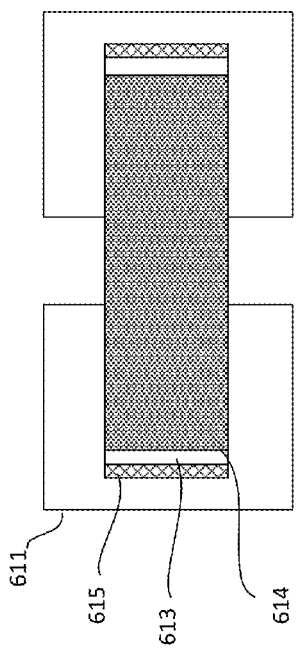

In one embodiment, the layers are subsequently patterned by mask and etch techniques to form a memory element pattern. The top view of the memory element pattern is shown in FIG. 8g. For example, a third lithography mask may be used to pattern a photoresist layer that is formed over the top surfaces of the layers. The patterned photoresist layer serves as an etch mask. An etch, such as RIE, may be performed to pattern the layer using the patterned resist mask and the patterned free layers 615 are in the form of spacers disposed adjacent to the L-shaped tunneling barrier layer.

Figure 8H:
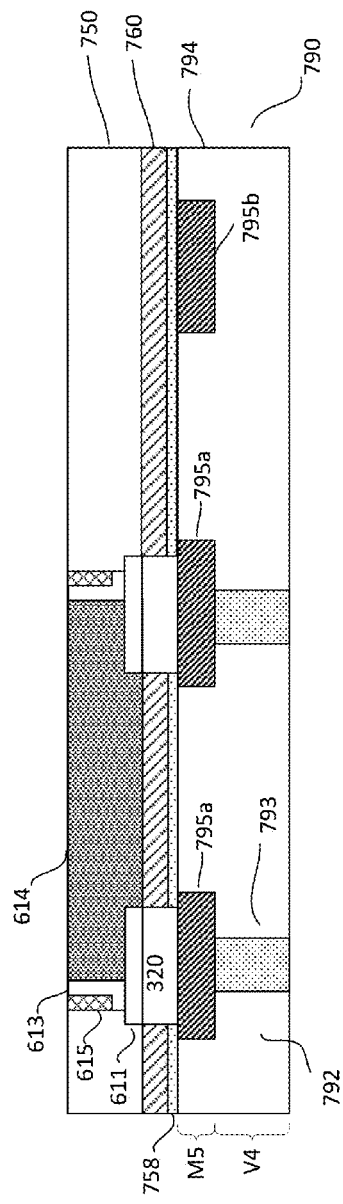

In FIG. 8h, a dielectric layer 750 is formed on the substrate. The dielectric layer 750 is formed over the dielectric layer 760 and sufficiently covers the memory element. The dielectric layer, for example, is silicon oxide. Other types of dielectric layers may also be useful. The dielectric layer may be formed by CVD. Other techniques for forming the dielectric layer may also be useful. The dielectric layer 750 and dielectric layer 760 correspond to a storage dielectric layer.

A planarizing process is performed on the substrate, planarizing the dielectric layer 750. The planarizing process, for example, is a CMP process. The CMP produces a planar top surface between the top of the memory elements and dielectric layer 750.

In another embodiment, the portion of the hard mask layer which fills the gap 740 and the portion above the gap 740 is removed, leaving a gap in between. Subsequently, the gap is filled by the dielectric layer 750. For example, a dielectric layer is formed in the gap and subsequently the dielectric layer 750 is formed on the substrate in a process step as illustrated in FIG. 8h. Such processing results in the configuration of memory element pair 505 as shown in FIG. 5.

Figure 8I:
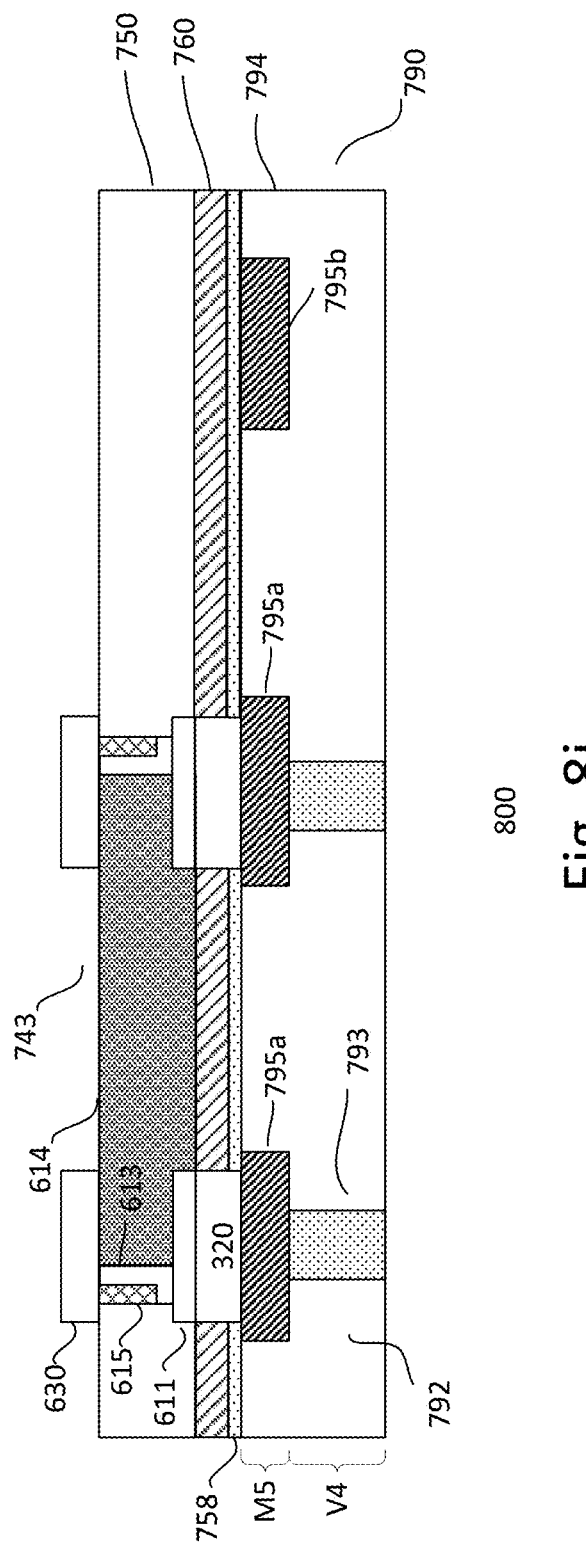

Referring to FIG. 8i, a top electrode layer is subsequently formed on the planar top surface. The top electrode layer is patterned by a mask and etch to form individual top electrodes 630. For example, the first lithography mask may be used to pattern a photoresist layer that is formed on the top electrode layer. The patterned photoresist serves as an etch mask. An etch, such as RIE, may be performed to pattern the layer using the patterned resist mask.

The forming of the individual top electrodes 630 completes the formation of the single stack dual memory element 600 of FIG. 6. The single stack dual memory element includes a first memory element 600a and a second memory element 600b separated by a gap 743.

Additional processes may be performed to complete forming the device. For example, the processes may include the processes illustrated in FIGS. 7n-7o, as wells as forming additional ILD levels, pad level, passivation level, pad opening, dicing, assembly and testing. Other types of processes may also be performed.

The process as described in FIGS. 7a-7o and FIGS. 8a-8i result in advantages. The process 700 or 800 as described is highly compatible with logic processing or technology. This avoids the investment of new tools and the process enables MTJ elements with reduced intrinsic critical current Ic without compromising thermal stability factor to be formed.

The present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method for forming a device, comprising:
   providing a substrate comprising circuit components formed on a horizontal substrate surface along a horizontal plane of the substrate;
   performing back-end-of-line processing to form an inter-level dielectric (ILD) layer of the device over the substrate, wherein the ILD layer comprises a metal level dielectric Mi with metal interconnects over a via contact level dielectric Vi−1 with via contacts, where i is the $i^{th}$ ILD layer of the device with n ILD layers; and
   forming a magnetic tunneling junction (MTJ) stack in a cell dielectric level, wherein the cell dielectric level comprises a via level dielectric Vi which is disposed over Mi, wherein the MTJ stack comprises:
a bottom electrode;
a fixed layer on the bottom electrode, the fixed layer comprising a fixed layer width W3 along a width direction and a fixed layer length L3 along a length direction, wherein the width direction and length direction are along the horizontal plane of the substrate,
a tunneling barrier layer formed on the fixed layer,
a free layer formed on the tunneling barrier layer, the free layer comprising a free layer width W2 along the width direction and a free layer length L2 along the length direction,
a hard mask layer formed over the fixed layer, wherein a first vertical sidewall of the free layer along the length direction is disposed adjacent to a first vertical sidewall of the hard mask layer along the length direction, and wherein the hard mask layer comprises a hard mask width W1 along the width direction and a hard mask length L1 along the length direction, and
wherein W2 is less than W1 and W2+W1 is less than W3.

2. The method of claim 1 wherein forming the MTJ stack includes forming a lower portion of the MTJ stack comprising:
depositing the fixed layer on the bottom electrode;
depositing the tunneling barrier layer on the fixed layer, wherein the fixed layer and the tunneling barrier layer form lower layers of the MTJ stack; and
patterning the fixed layer and tunneling barrier layer to form the lower portion of the MTJ stack by performing a first etch using a first lithography mask, wherein the lower portion of the MTJ stack comprises a lower portion length in the length direction which is equal to L3 and a lower portion width in the width direction which is equal to W3.

3. The method of claim 2 continues forming an upper portion of the MTJ stack comprising:
forming the hard mask layer, the hard mask layer covers the lower portion of the MTJ stack, wherein the hard mask layer comprises a planar top hard mask surface;
forming a top electrode layer on the hard mask layer;
patterning the hard mask layer and top electrode layer over the lower portion of MTJ stack using a second etch with a second lithographic mask to form an initial upper portion of the MTJ stack over the lower portion of the MTJ stack;
forming the free layer, the free layer lining the initial upper portion of the MTJ stack;
patterning the free layer to form a free layer spacer on sides of the initial upper portion of the MTJ stack, wherein the free layer spacer has a top free layer surface below a top electrode surface; and
patterning the initial upper portion of the MTJ stack using a third etch with a third lithographic mask to form an upper portion of the MTJ stack, wherein the upper portion of the MTJ stack comprises
a top electrode and hard mask stack, wherein the top electrode and hard mask stack comprises a stack length in the length direction which is equal to L1 and a stack width in the width direction which is equal to W1, and
the free layer is disposed adjacent to a first stack length side of the top electrode and hard mask stack, wherein L2=L1.

4. The method of claim 1 wherein:
the width direction is along a wordline direction of the device; and
the length direction is along a bitline direction of the device.

5. The method of claim 1 wherein forming the MTJ stack includes forming a lower portion of the MTJ stack comprising:
depositing the fixed layer on the bottom electrode; and
patterning the fixed layer to form the lower portion of the MTJ stack by performing a first etch using a first lithography mask, wherein the lower portion of the MTJ stack comprises the fixed layer with the fixed layer length L3 and the fixed layer width W3.

6. The method of claim 5 wherein forming the MTJ stack includes forming an upper portion of the MTJ stack comprising:
forming the hard mask layer on the substrate covering the lower portion of the MTJ stack, wherein the hard mask layer comprises a planar top hard mask surface;
patterning the hard mask layer using a second etch with a second lithographic mask to form an initial upper portion of the MTJ stack over the lower portion of the MTJ stack;
forming the tunneling barrier layer lining the initial upper portion of the MTJ stack;
forming the free layer lining the tunneling barrier layer;
patterning the tunneling barrier layer and free layer to form a free layer spacer on sides of the initial upper portion of the MTJ stack, the free layer spacer includes an L-shaped tunneling barrier layer isolating the free layer spacer from a top fixed layer surface of the fixed layer and sides of the initial upper portion of the MTJ stack; and
patterning the initial upper portion of the MTJ stack using a third etch with a third lithographic mask to form an upper portion of the MTJ stack, wherein the upper portion of the MTJ stack comprises
the hard mask layer disposed on the fixed layer having L1 and W1, and
the free layer spacer with the L-shaped tunneling barrier layer disposed adjacent the first vertical sidewall of the hard mask layer.

7. The method of claim 1 wherein the tunneling barrier layer includes a tunneling barrier width along the width direction which is equal to W3 and a tunneling barrier length along the length direction which is equal to L3.

8. The method of claim 1 wherein:
the tunneling barrier layer is disposed below a bottom of the free layer and between a first free layer length side and a first hard mask length side;
a top free layer surface of the free layer, a top tunneling barrier surface of the tunneling barrier layer and top hard mask surface of the hard mask layer are coplanar; and
a top electrode disposed over the coplanar top free layer surface, top tunneling barrier surface, and top hard mask surface.

9. A method of forming a device, comprising:
providing a substrate comprising circuit components formed on a substrate surface;
performing back end of line processing to form an upper interlevel dielectric (ILD) layer over the substrate, wherein the upper ILD layer comprises a plurality of ILD levels; and forming a pair of magnetic tunneling junction (MTJ) stacks in between adjacent ILD levels of the upper ILD layer, wherein each of the MTJ stacks comprises:
a fixed layer, the fixed layer comprising a first width,
a tunneling barrier layer formed on the fixed layer,
a free layer formed on the tunneling barrier layer, the free layer comprising a second width, and wherein the first width is wider than the second width, and
wherein forming the pair of the MTJ stacks in between adjacent ILD levels comprises:
forming a pair of bottom electrodes in a lower dielectric layer of a lower ILD level of the adjacent ILD levels, and
forming MTJ stack layers and top electrodes over the lower dielectric layer and the bottom electrodes, wherein forming the MTJ stack layers and top electrodes over the lower dielectric layer and the bottom electrodes comprises:
forming a pair of stacks comprising the fixed layer over the lower dielectric layer and bottom electrode, wherein the pair of stacks comprises a first stack and a second stack separated by a first gap,
forming a hard mask layer over the pair of stacks, wherein sidewalls of the hard mask layer are displaced from sidewalls of the fixed layer, exposing outer portions of the fixed layer
forming the tunneling barrier layer and free layer on the sidewalls of the hard mask layer, wherein the tunneling barrier layer, free layer and hard mask layer have a co-planar top surface,
patterning the hard mask layer, tunneling barrier layer and free layer to form individual stacks, wherein the individual stacks are bridged by the hard mask layer, and
forming top electrodes on the co-planar top surface of the stacks.

10. The method of claim 9 wherein forming the pair of stacks comprises:
depositing the fixed layer over the lower dielectric layer and the bottom electrodes; and
patterning the fixed layer to form the pair of stacks using a first lithography mask.

11. The method of claim 9 wherein forming the hard mask layer over the pair of stacks comprises:
depositing a hard mask layer over the pair of stacks, wherein the hard mask fills the first gap; and
patterning the hard mask layer to expose outer portions of the fixed layer of the pair of stacks using a second lithography mask.

12. The method of claim 9 wherein forming the tunneling barrier layer and free layer on the sidewalls of the hard mask layer comprises:
depositing a conformal layer of tunneling barrier layer over the fixed layer and hard mask layer;
depositing a conformal free layer on the tunneling barrier layer; and
etching the free layer and tunneling barrier layer to form an L-shaped tunneling barrier layer and a free layer spacer on a sidewall of the L-shaped tunneling barrier layer.

13. The method of claim 10 wherein forming the top electrodes on the co-planar top surface comprises:
depositing a dielectric layer over the individual stacks;
planarizing the dielectric layer to obtain a co-planar top surface of the hard mask layer, tunneling barrier layer and free layer;

depositing a top electrode layer on the co-planar top surface; and
patterning the top electrode layer using the first lithography mask.

14. The method of claim 7 wherein the MTJ stack further comprises:
a top electrode disposed on the hard mask layer, wherein sides of the top electrode are aligned with sides of the hard mask layer to form a top electrode and hard mask stack,
wherein the free layer is disposed adjacent to a first stack length side of the top electrode and hard mask stack, wherein a top free layer surface of the free layer is disposed above a top hard mask surface of the hard mask layer and below a top surface of the top electrode.

15. A method for forming a device comprising:
providing a substrate comprising circuit components formed on a horizontal substrate surface along a horizontal plane of the substrate; and
forming a magnetic tunneling junction (MTJ) stack in a cell dielectric level of a back-end-of-line (BEOL) dielectric layer having a plurality of interlevel dielectric (ILD) levels, wherein forming the MTJ stack comprises:
forming a fixed layer having a top surface and a bottom surface along the horizontal plane of the substrate, wherein the fixed layer has a first width along a width direction and a first length along a length direction, and the length direction and the width direction are along the horizontal plane of the substrate,
forming a tunneling barrier layer on the top fixed layer surface,
forming a free layer on the tunneling barrier layer, wherein the free layer has a second width along the width direction and a vertical sidewall along the length direction, and
forming a hard mask layer over the top surface of the fixed layer surface, wherein the hard mask layer has a third width along the width direction, the hard mask layer has a vertical sidewall along the length direction, and the vertical sidewall of the hard mask layer is disposed adjacent to the vertical sidewall of the free layer,
wherein the second width of the free layer is less than the third width of the hard mask layer, and the sum of the second width of the free layer and the third width of the hard mask layer is less than the first width of the fixed layer.

16. The method of claim 15 wherein forming the MTJ stack further comprises:
forming a bottom electrode,
wherein the fixed layer is formed on the bottom electrode.

17. The method of claim 15 wherein forming the MTJ stack further comprises:
forming a top electrode layer on the hard mask layer, the top electrode layer comprising a vertical sidewall; and
wherein
forming the free layer comprises forming the free layer on the vertical sidewalls of the hard mask layer and top electrode layer in the length direction, and
the free layer is disposed on the tunneling barrier layer.

18. The method of claim 17 wherein a top surface of the free layer is disposed above a top surface of the hard mask layer.

19. The method of claim 15 wherein:
the tunneling barrier layer is disposed below the free layer and between vertical sidewalls of the free layer and the hard mask layer in the length direction; and
the method further comprises forming a top electrode layer, wherein the top electrode layer is formed on top of the free layer, and the hard mask layer and the tunneling barrier layer are between the vertical sidewalls of the free layer and the hard mask layer.

20. The method of claim 19 wherein a bottom surface of the tunneling barrier layer and a bottom surface of the hard mask layer abut each other and are disposed on the fixed layer.

* * * * *